(12) United States Patent
Nakamura et al.

(10) Patent No.: US 11,555,691 B2
(45) Date of Patent: Jan. 17, 2023

(54) SUBSTRATE INSPECTION SYSTEM, SUBSTRATE INSPECTION METHOD AND RECORDING MEDIUM

(71) Applicant: Tokyo Electron Limited, Tokyo (JP)

(72) Inventors: Hiroshi Nakamura, Koshi (JP); Toyohisa Tsuruda, Koshi (JP); Yasuaki Noda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 291 days.

(21) Appl. No.: 16/896,455

(22) Filed: Jun. 9, 2020

(65) Prior Publication Data
US 2020/0386538 A1 Dec. 10, 2020

(30) Foreign Application Priority Data

Jun. 10, 2019 (JP) .............................. JP2019-108143

(51) Int. Cl.
| | |
|---|---|
| *G01B 11/28* | (2006.01) |
| *G01B 11/06* | (2006.01) |
| *G06T 7/90* | (2017.01) |
| *G06T 7/00* | (2017.01) |
| *G06T 7/60* | (2017.01) |
| *G03F 7/20* | (2006.01) |
| *H01L 21/66* | (2006.01) |

(52) U.S. Cl.
CPC ........ *G01B 11/0616* (2013.01); *G06T 7/0004* (2013.01); *G06T 7/60* (2013.01); *G06T 7/90* (2017.01); *G03F 7/70608* (2013.01); *G06T 2207/30148* (2013.01); *H01L 22/12* (2013.01)

(58) Field of Classification Search
CPC ............ G01B 11/0616; G01B 11/0625; G06T 7/0004; G06T 7/60; G06T 7/90; G06T 2207/30148; G06T 2207/10024; G03F 7/70608; G03F 7/70491; G03F 7/7085; H01L 22/12; H04N 5/23229
USPC ......................................................... 356/630
See application file for complete search history.

(56) References Cited

U.S. PATENT DOCUMENTS

| | | | | |
|---|---|---|---|---|
| 2008/0111998 A1* | 5/2008 | Edge | ........................ | H04N 1/52 358/1.9 |
| 2015/0262383 A1* | 9/2015 | Yajko | .................... | G06T 7/0004 382/108 |

FOREIGN PATENT DOCUMENTS

JP 2015-215193 A 12/2015

* cited by examiner

*Primary Examiner* — Md M Rahman
(74) *Attorney, Agent, or Firm* — Pearne & Gordon LLP

(57) ABSTRACT

A substrate inspection system includes an imaging unit provided in a substrate processing apparatus and configured to acquire image data by imaging a surface of a substrate for color information on which a film is formed; a film thickness measurement unit provided in the substrate processing apparatus and configured to measure a film thickness of a substrate for film thickness measurement on which a film is formed under same conditions as on the substrate for color information; and a model creation unit configured to create a film thickness model corresponding to a correlation between information about color change on the surface of the substrate for color information caused by forming the film, which is acquired based on the image data, and the film thickness of the substrate for film thickness measurement, which is measured by the film thickness measurement unit.

11 Claims, 15 Drawing Sheets

SUBSTRATE INSPECTION SYSTEM, SUBSTRATE INSPECTION METHOD AND RECORDING MEDIUM

CROSS-REFERENCE TO RELATED APPLICATION

This application claims the benefit of Japanese Patent Application No. 2019-108143 filed on Jun. 10, 2019, the entire disclosure of which is incorporated herein by reference.

TECHNICAL FIELD

The exemplary embodiments described herein pertain generally to a substrate inspection system, a substrate inspection method and a recording medium.

BACKGROUND

Patent Document 1 discloses a configuration for calculating a film thickness of a film formed on a substrate on the basis of an image of a surface of the substrate. Patent Document 1 also discloses that correlation data between a pixel value obtained from a preparation image and a film thickness measurement value at each coordinates corresponding to the pixel value is used.

Patent Document 1: Japanese Patent Laid-open Publication No. 2015-215193

SUMMARY

In one exemplary embodiment, there is provided a substrate inspection system provided with a substrate processing apparatus configured to perform film formation on a target substrate. The substrate inspection system includes an imaging unit provided in the substrate processing apparatus and configured to acquire image data by imaging a surface of a substrate for color information on which a film is formed; a film thickness measurement unit provided in the substrate processing apparatus and configured to measure a film thickness of a substrate for film thickness measurement on which a film is formed under same conditions as on the substrate for color information; and a model creation unit configured to create a film thickness model corresponding to a correlation between information about color change on the surface of the substrate for color information caused by forming the film, which is acquired based on the image data, and the film thickness of the substrate for film thickness measurement, which is measured by the film thickness measurement unit.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
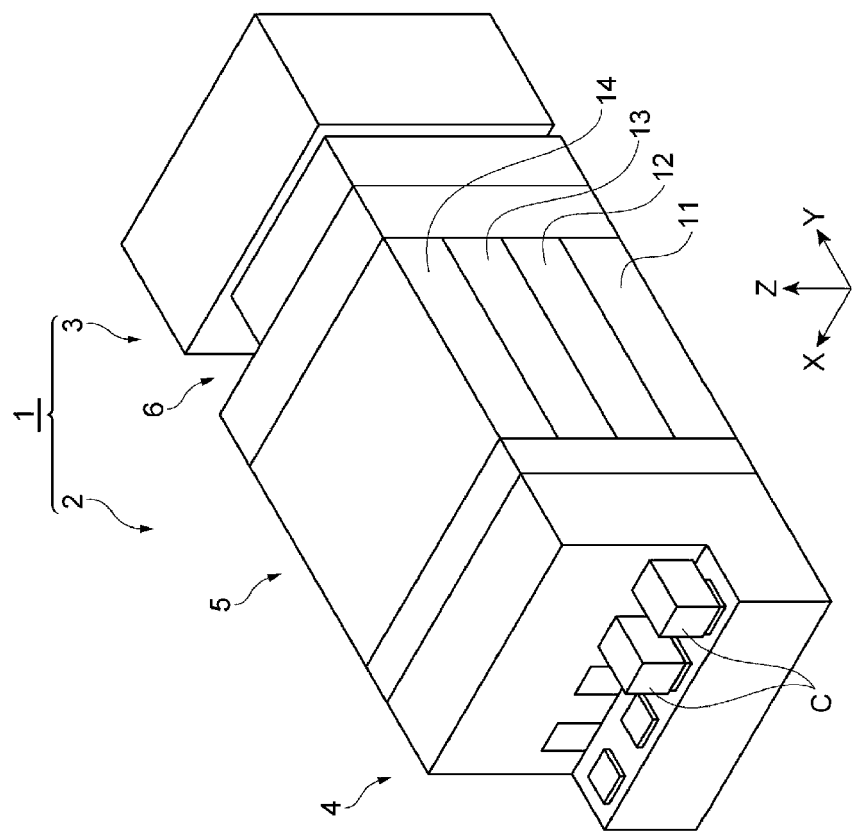
FIG. 1 is a view illustrating an example of a schematic configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In one exemplary embodiment, there is provided a substrate inspection system provided with a substrate processing apparatus configured to perform film formation on a target substrate. The substrate inspection system includes an imaging unit provided in the substrate processing apparatus and configured to acquire image data by imaging a surface of a substrate for color information on which a film is formed; a film thickness measurement unit provided in the substrate processing apparatus and configured to measure a film thickness of a substrate for film thickness measurement on which a film is formed under same conditions as on the substrate for color information; and a model creation unit configured to create a film thickness model corresponding to a correlation between information about color change on the surface of the substrate for color information caused by forming the film, which is acquired based on the image data, and the film thickness of the substrate for film thickness measurement, which is measured by the film thickness measurement unit.

According to the substrate inspection system, in the substrate processing apparatus, the information about color change on the surface of the substrate for color information is acquired on the basis of the image data of the surface of the substrate, and the film thickness of the substrate for film thickness measurement on which the film has been formed under the same conditions is measured by the film thickness measurement unit of the substrate processing apparatus. Then, the film thickness model indicative of the correlation between the information about color change and the film thickness is created by combining these information. Therefore, it is possible to more simply create a model for calculating the film thickness of the film on the target substrate.

The substrate inspection system may further include a film thickness calculation unit. The imaging unit may be configured to acquire image data of the target substrate by imaging the target substrate on which a film is formed. The film thickness calculation unit may be configured to estimate a film thickness of the target substrate based on information about color change on the surface of the target substrate caused by forming the film, which is acquired based on the image data of the target substrate, and the film thickness model.

With the above-described configuration, the film thickness of the target substrate is estimated by the film thickness calculation unit on the basis of the film thickness model and the information about color change on the surface of the target substrate caused by forming the film, which is acquired based on the image data of the target substrate. Therefore, the model obtained as described above can be applied appropriately to film thickness estimation of the target substrate.

The substrate inspection system may further include a film forming unit configured to perform multiple processings of forming the film on each of the substrate for color information and the substrate for film thickness measurement. The film forming unit may alternately perform a processing of forming the film on the substrate for color information and a processing of forming the film on the substrate for film thickness measurement.

As described above, in the film forming unit configured to form the film on the substrate for color information and the substrate for film thickness measurement, these substrates are processed alternately. Thus, the films can be formed on the substrate for color information and the substrate for film thickness measurement, respectively, under more similar conditions. Therefore, it is possible to more precisely match the information about color change obtained from the substrate for color information with the film thickness obtained from substrate for film thickness measurement. Thus, it is possible to create the model with higher precision.

The substrate for film thickness measurement may have a flat surface.

As described above, the substrate having the flat surface is used as the substrate for film thickness measurement and the film is formed on the substrate for film thickness measurement and the film thickness thereof is measured. Therefore, the film thickness measurement unit can measure the film thickness more precisely. Thus, it is possible to create the model with higher precision.

The imaging unit and the film thickness measurement unit may be provided in a single unit.

As described above, if the imaging unit and the film thickness measurement unit are provided in the single unit, it is possible to suppress the scale-up of the apparatus and achieve the apparatus configuration for simply creating the model.

In another exemplary embodiment, there is provided a substrate inspection method performed in a substrate inspection system including a substrate processing apparatus configured to perform film formation on a target substrate. The substrate inspection method includes acquiring image data by imaging a surface of a substrate for color information on which a film is formed in the substrate processing apparatus; measuring a film thickness of a substrate for film thickness measurement on which a film is formed under same conditions as on the substrate for color information in the substrate processing apparatus; and creating a film thickness model corresponding to a correlation between information about color change on the surface of the substrate for color information caused by forming the film, which is acquired based on the image data, and the film thickness measured in the measuring of the film thickness.

According to the above-described substrate inspection method, the information about color change on the surface of the substrate for color information is acquired the basis of the image data of the surface of the substrate, and the film thickness of the substrate for film thickness measurement on which the film has been formed under the same conditions is measured. Then, the film thickness model indicative of the correlation between the information about color change and the film thickness is created by combining these information. Therefore, it is possible to more simply create the model for calculating the film thickness of the film on the target substrate.

The substrate inspection method may further include estimating a film thickness of the target substrate based on information about color change on a surface of the target substrate caused by forming the film, which is acquired based on image data of the target substrate obtained by imaging the target substrate on which the film is formed, and the film thickness model.

With the above-described configuration, the film thickness of the target substrate is estimated on the basis of the film thickness model and the information about color change on the surface of the target substrate caused by forming the film, which is acquired based on the image data of the target substrate. Therefore, the model obtained as described above can be applied appropriately to the film thickness estimation of the target substrate.

The substrate inspection method may further include performing multiple processings of forming the film on each of the substrate for color information and the substrate for film thickness measurement. In the performing of the multiple processings, forming the film on the substrate for color information and forming the film on the substrate for film thickness measurement are performed alternately.

As described above, in the performing of the multiple processings of forming the film on each of the substrate for color information and the substrate for film thickness measurement, these substrates are processed alternately. Thus, the films can be formed on the substrate for color information and the substrate for film thickness measurement, respectively, under more similar conditions. Therefore, it is possible to more precisely match the information about color change obtained from the substrate for color information with the film thickness obtained from substrate for film thickness measurement. Thus, it is possible to create the model with higher precision.

In the substrate inspection method, the substrate for film thickness measurement may have a flat surface.

As described above, the substrate having the flat surface is used as the substrate for film thickness measurement and the film is formed on the substrate for film thickness measurement and the film thickness thereof is measured. Therefore, the film thickness measurement unit can measure film thickness more precisely. Thus, it is possible to create the model with higher precision.

The acquiring of the image data and the measuring of the film thickness may be performed in parallel.

As described above, if the acquiring of the image data and the measuring of the film thickness are performed concurrently, it is possible to reduce the time required for each processing for creating the model. Thus, it is possible to more simply create the model.

In still another exemplary embodiment, there is provided a computer-readable recording medium having stored thereon computer-executable instructions that, in response to execution, cause an apparatus to perform a substrate inspection method.

Hereinafter, various exemplary embodiments of the present disclosure will be explained with reference to the accompanying drawings. Further, in the drawings, similar symbols typically identify similar components, unless context dictates otherwise.

[Substrate Processing System]

A substrate processing system 1 is configured to form a photosensitive film on a substrate, expose the photosensitive film and develop the photosensitive film. A processing target substrate is, for example, a semiconductor wafer W.

The substrate processing system 1 includes a coating/developing apparatus 2 and an exposure apparatus 3. The exposure apparatus 3 performs an exposure processing of a resist film (photosensitive film) formed on the wafer W (substrate). Specifically, the exposure apparatus 3 irradiates an energy ray to an exposure target portion of the resist film through liquid immersion exposure or the like. The coating/developing apparatus 2 performs a processing of forming the resist film on the surface of the wafer W (substrate) before the exposure processing by the exposure apparatus 3, and performs a developing processing of the resist film after the exposure processing.

[Substrate Processing Apparatus]

Figure 2:
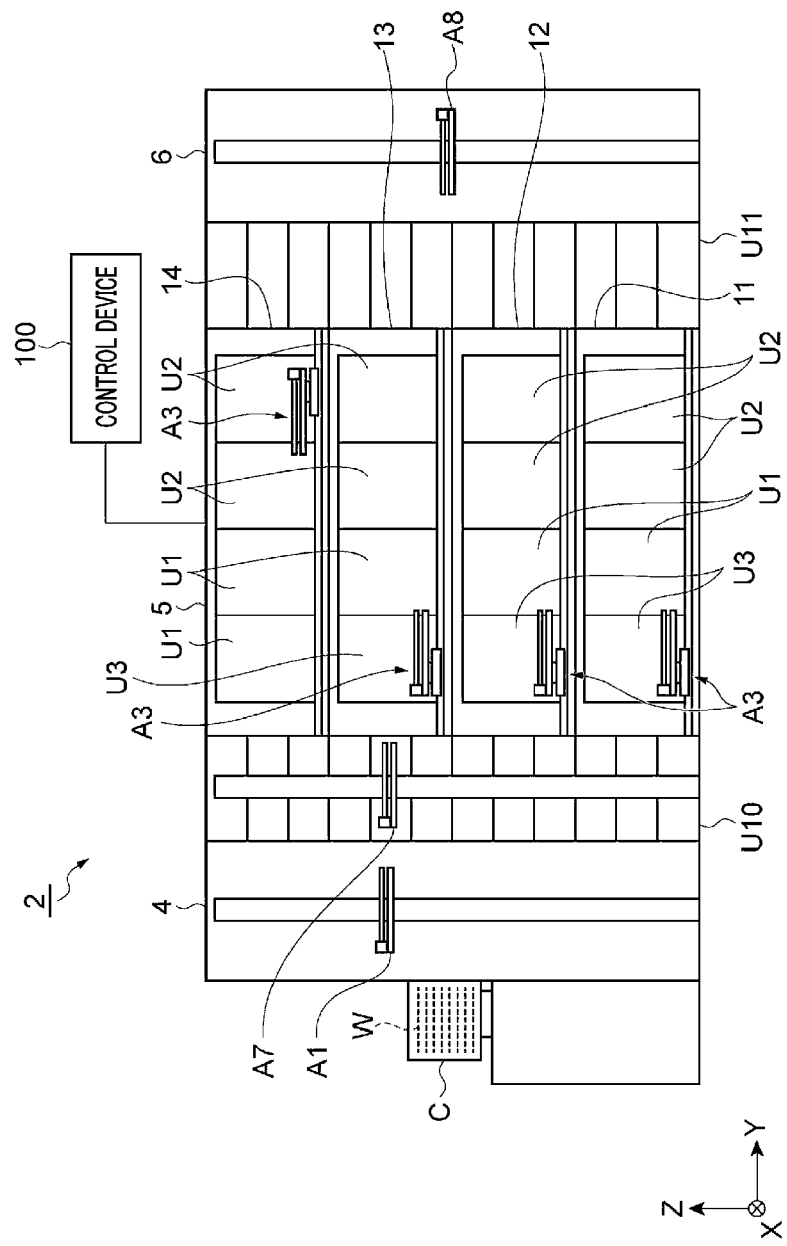
FIG. 2 is a schematic diagram illustrating an example of a coating/developing apparatus.

Hereinafter, a configuration of the coating/developing apparatus 2 which is an example of a substrate processing apparatus will be described. As illustrated in FIG. 1 and FIG. 2, the coating/developing apparatus 2 includes a carrier block 4, a processing block 5, an interface block 6 and a control device 100 (controller). The coating/developing apparatus 2 to be described in the present exemplary embodiment as the substrate processing apparatus corresponds to a substrate inspection system configured to inspect a film formation status on the substrate. The function as the substrate inspection system will be described later.

The carrier block 4 is configured to carry the wafer W into/from the coating/developing apparatus 2. For example, the carrier block 4 is configured to support a plurality of carriers C (receptors) for wafers W and includes therein a transfer device A1 including a delivery arm. Each carrier C is configured to accommodate therein, for example, a plurality of circular wafers W. The transfer device A1 is configured to take out the wafer W from the carrier C to deliver the wafer W to the processing block 5, and receive the wafer W from the processing block 5 to return the wafer W back into the carrier C. The processing block 5 includes a plurality of processing modules 11, 12, 13 and 14.

The processing module 11 includes therein a plurality of coating units U1, a plurality of heat treatment units U2, a plurality of inspection units U3 and a transfer device A3 configured to transfer the wafer W to these units. The processing module 11 forms an underlying film on the surface of the wafer W by the coating units U1 and the heat treatment units U2. Each of the coating units U1 of the processing module 11 is configured to coat a processing liquid for forming the underlying film on the wafer W while, for example, rotating the wafer W at a predetermined rotation number. The heat treatment units U2 of the processing module 11 perform various heat processings required for forming the underlying film. Each of the heat treatment units U2 includes therein, for example, a heating plate and a cooling plate, and is configured to perform a heat processing by heating the wafer W to a predetermined temperature by the heating plate and cooling the heated wafer W by the cooling plate. The inspection units U3 perform processings for inspecting the surface status of the wafer W and acquire information indicative of the surface status of the wafer W, such as surface image or film thickness.

The processing module 12 includes therein a plurality of coating units U1, a plurality of heat treatment units U2, a plurality of inspection units U3 and a transfer device A3 configured to transfer the wafer W to these units. The processing module 12 forms an intermediate film on the underlying film by the coating units U1 and the heat treatment units U2. Each of the coating units U1 of the processing module 12 is configured to form a coating film on the surface of the wafer W by coating a processing liquid for forming the intermediate film on the underlying film. The heat treatment units U2 of the processing module 12 perform various heat processings required for forming the intermediate film. Each of the heat treatment units U2 includes therein, for example, a heating plate and a cooling plate, and is configured to perform a heat processing by heating the wafer W to a predetermined temperature by the heating plate and cooling the heated wafer W by the cooling plate. The inspection units U3 perform processings for inspecting the surface status of the wafer W and acquire information indicative of the surface status of the wafer W, such as surface image or film thickness.

The processing module 13 includes therein a plurality of coating units U1, a plurality of heat treatment units U2, a plurality of inspection units U3 and a transfer device A3 configured to transfer the wafer W to these units. The processing module 13 forms a resist film on the intermediate film by the coating units U1 and the heat treatment units U2. Each of the coating units U1 of the processing module 13 is configured to coat a processing liquid for forming the resist film on the intermediate film while, for example, rotating the wafer W at a predetermined rotation number. The heat treatment units U2 of the processing module 13 perform various heat processings required for forming the resist film. The heat treatment units U2 of the processing module 13 form the resist film by performing a heat processing (Pre Applied Bake (PAB)) on the wafer W having the coating film thereon at a predetermined heating temperature. The inspection units U3 perform processings for inspecting the surface status of the wafer W and acquire information indicative of the surface status of the wafer W, such as film thickness.

The processing module 14 includes therein a plurality of coating units U1, a plurality of heat treatment units U2 and a transfer device A3 configured to transfer the wafer W to these units. The processing module 14 performs a developing processing of the exposed resist film R by the coating units U1 and the heat treatment units U2. Each of the coating units U1 of the processing module 14 performs the developing processing of the resist film R by coating a developing solution on the surface of the exposed wafer W and then washing it with a rinse liquid while, for example, rotating the wafer W at a predetermined rotation number. The heat treatment units U2 of the processing module 14 perform various heat processings required for performing the developing processing. Specific examples of the heat processings may include a heat processing performed before the developing processing (PEB: Post Exposure Bake), a heat processing performed after the developing processing (PB: Post Bake), and the like.

Within the processing block 5, a shelf unit U10 is provided at a side of the carrier block 4. The shelf unit U10 is partitioned into a plurality of cells arranged in a vertical direction. A transfer device A7 including an elevation arm is provided near the shelf unit U10. The transfer device A7 is configured to move the wafer W up and down among the cells of the shelf unit U10.

Within the processing block 5, a shelf unit U11 is provided at a side of the interface block 6. The shelf unit U11 is partitioned into a plurality of cells arranged in the vertical direction.

The interface block 6 is configured to deliver the wafer W into/from the exposure apparatus 3. For example, the interface block 6 includes therein a transfer device A8 including a delivery arm and is connected with the exposure apparatus 3. The transfer device A8 is configured to deliver the wafer W placed in the shelf unit U11 to the exposure apparatus 3, and receives the wafer W from the exposure apparatus 3 to return the received wafer W back into the shelf unit U11.

[Inspection Unit]

Hereinafter, the inspection unit U3 included in each of the processing modules 11 to 13 will be described. The inspection unit U3 acquires information about the surface of the film (underlying film, intermediate film or resist film) formed by the coating units U1 and the heat treatment units U2 and information about the film thickness thereof.

Figure 3:
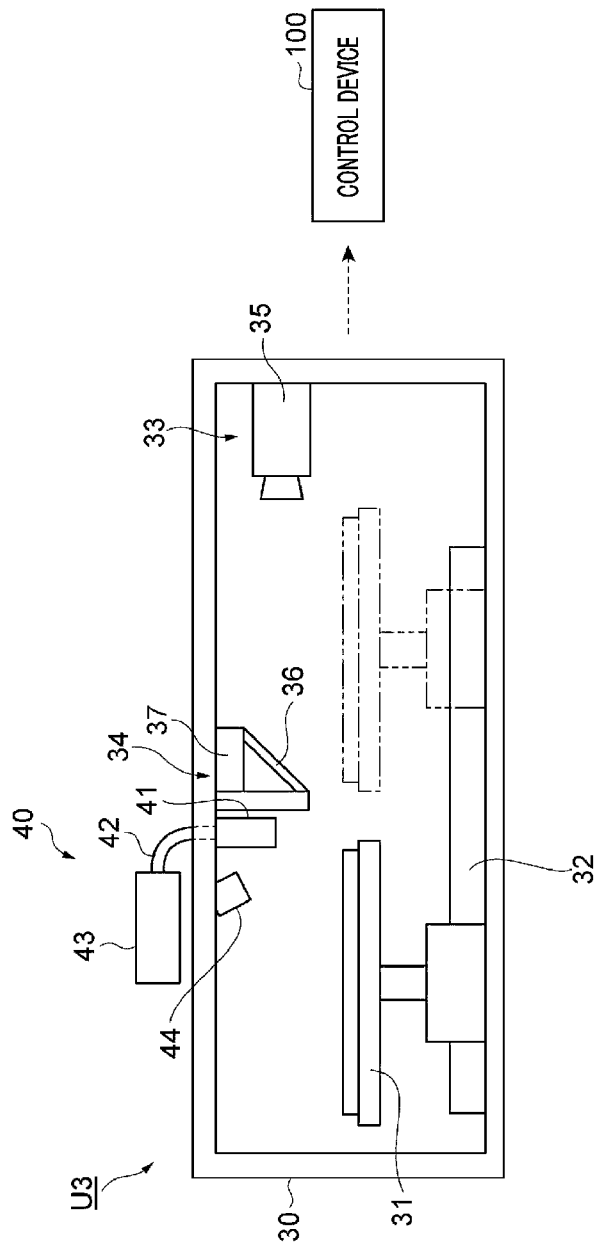
FIG. 3 is a schematic diagram illustrating an example of an inspection unit.

As illustrated in FIG. 3, the inspection unit U3 includes a housing 30, a holder 31, a linear driver 32, an imaging unit 33, an illumination/reflection unit 34 and a spectrum measurement unit 40. The holder 31 is configured to horizontally hold the wafer W. The linear driver 32 is configured to move the holder 31 along a horizontal linear path with an electric motor as a driving force source. The imaging unit 33 includes a camera 35 such as a CCD camera. The camera 35 is provided at one end side of a movement direction of the holder 31 within the inspection unit U3 and faces the other end side of the movement direction. The illumination/reflection unit 34 is configured to illuminate an imaging range and induces reflection light from the imaging range toward the camera 35. For example, the illumination/reflection unit 34 includes a half mirror 36 and a light source 37. The half mirror 36 is located higher than the holder 31 and disposed at an intermediate portion of a movement range of the linear driver 32 and reflects light from below toward the camera 35. The light source 37 is provided on the half mirror 36 and irradiates illumination light downwards through the half mirror 36.

The spectrum measurement unit 40 functions to receive light from the wafer W, separate the light into spectroscopic components and acquire a spectrum thereof. The spectrum measurement unit 40 includes a light receiving unit 41 configured to receive the light from the wafer W, a waveguide unit 42 configured to guide the light incident on the light receiving unit 41, a spectrometer 43 configured to obtain the spectrum by separating the light guided by the waveguide unit 42 into the spectroscopic components, and a light source 44. The light receiving unit 41 is configured to receive light from a central portion of the wafer W when the wafer W held by the holder 31 is moved by driving the linear driver 32. That is, the light receiving unit 41 is provided at a position corresponding to a movement path of the center of the holder 31 that is moved by driving the linear driver 32. Further, the light receiving unit 41 is mounted so that it can be moved relative to the surface of the wafer W along a diametric direction of the wafer W while the wafer W is moved by the movement of the holder 31. Thus, the spectrum measurement unit 40 can acquire a spectrum from each position along the diametric direction of the wafer W including the central portion of the wafer W. The waveguide unit 42 is formed of, for example, optical fiber or the like. The spectrometer 43 is configured to separate the incident light into spectroscopic components and acquire a spectrum including intensity information corresponding to each wavelength. The light source 44 is configured to irradiate the illumination light downwards. Thus, the light reflected from the wafer W is incident on the spectrometer 43 through the light receiving unit 41 and the waveguide unit 42.

The spectrum acquired by the spectrometer 43 may have, for example, the wavelength range for visible light (380 nm to 780 nm). Therefore, a light source emitting the visible light is used as the light source 44 and the spectrometer 43 separates the light, which has been irradiated from the light source 44 and then reflected from the surface of the wafer W, into its spectroscopic components to acquire spectrum data in the wavelength range for visible light. Further, the wavelength range of the spectrum acquired by the spectrometer 43 may not be limited to the wavelength range for visible light, and may include, for example, a wavelength range including infrared light or ultraviolet light. The spectrometer 43 and the light source 44 may be appropriately selected depending on the wavelength range for the acquired spectrum data.

The inspection unit U3 is operated as follows to acquire image data of the surface of a wafer W. First, the linear driver 32 moves the holder 31. Thus, the wafer W passes under the half mirror 36. While the wafer W passes under the half mirror 36, light reflected from each portion of the surface of the wafer W is sequentially transmitted to the camera 35. The camera 35 forms an image of the light reflected from each portion of the surface of the wafer W, and then, acquires image data of the surface of the wafer W. If a film thickness of a film formed on the surface of the wafer W is changed, the image data of the surface of the wafer W imaged by the camera 35 is changed, for example, the color of the surface of the wafer W is changed, depending on the film thickness. That is, the acquisition of the image data of the surface of the wafer W corresponds to the acquisition of the information indicative of the film thickness of the film formed on the surface of the wafer W. This will be described later in detail.

The image data acquired by the camera 35 is transmitted to the control device 100. The control device 100 estimates the film thickness of the film on the surface of the wafer W based on the image data and maintains the estimation result as an inspection result.

Also, the spectrum measurement unit 40 performs spectroscopic measurement of light projected from the surface of the wafer W at the same time when the inspection unit U3 acquires the image data. When the linear driver 32 moves the holder 31, the wafer W passes under the light receiving unit 41. While the wafer W passes under the light receiving unit 41, the light reflected from each portion of the surface of the wafer W is incident on the light receiving unit 41 and then incident on the spectrometer 43 through the waveguide unit 42. The spectrometer 43 separates the incident light into its spectroscopic components to acquire the spectrum data. If the film thickness of the film formed on the surface of the wafer W is changed, the spectrum is changed depending on, for example, the film thickness. That is, the acquisition of spectrum data of the surface of the wafer W corresponds to the acquisition of information indicative of the film thickness of the film formed on the surface of the wafer W. This will be described later in detail. The inspection unit U3 may concurrently perform the acquisition of the image data and the spectroscopic measurement. For this reason, the measurement can be performed in a short time compared with a case where these processings are separately performed.

The spectrum data acquired by the spectrometer 43 is transmitted to the control device 100. The control device 100 estimates the film thickness of the film on the surface of the wafer W based on the spectrum data and maintains the estimation result as an inspection result.

[Control Device]

An example of the control device 100 will be described in detail. The control device 100 controls each component included in the coating/developing apparatus 2. The control device 100 is configured to perform processings including forming each of the above-described films on the surface of the wafer W and performing the developing processing. Further, the control device 100 is configured to perform correction of processing parameters based on results of processings. Details of the processings will be described later.

Figure 4:
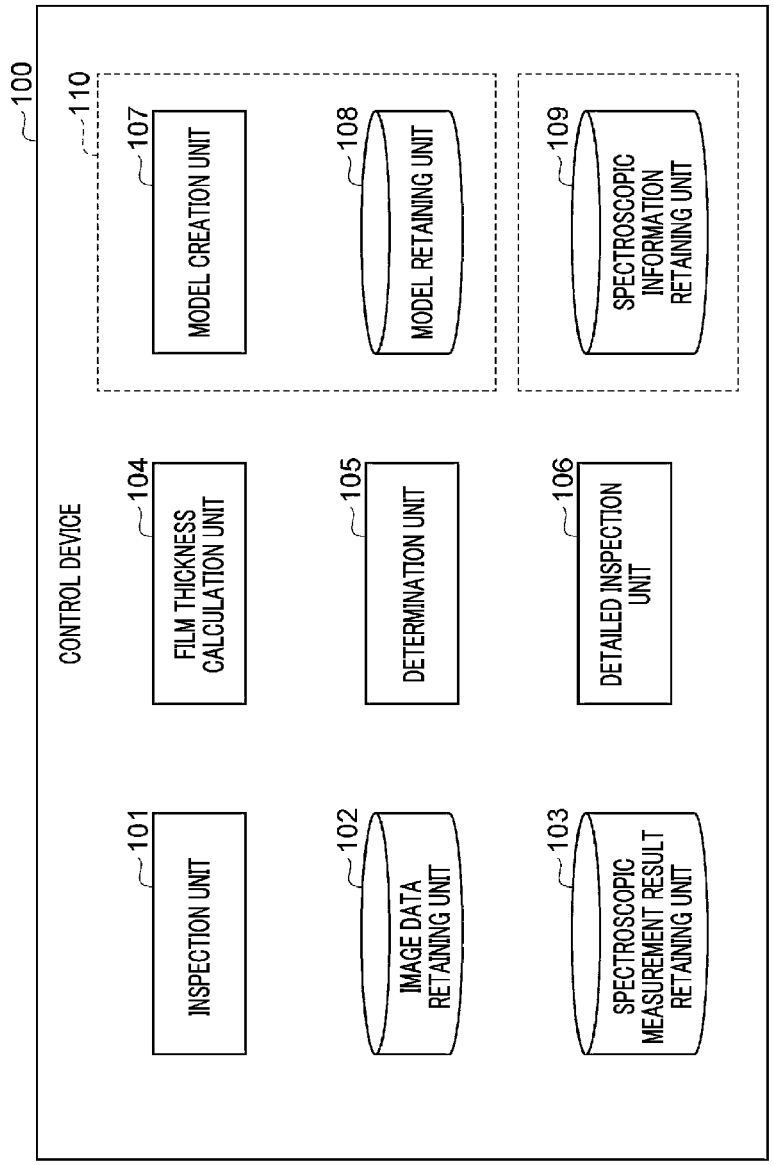
FIG. 4 is a block diagram illustrating an example of a functional configuration of a control device.

As illustrated in FIG. 4, the control device 100 includes, as functional components, an inspection unit 101, an image data retaining unit 102, a spectroscopic measurement result retaining unit 103, a film thickness calculation unit 104, a determination unit 105, a detailed inspection unit 106, a model creation unit 107, a model retaining unit 108 and a spectroscopic information retaining unit 109.

The inspection unit 101 functions to control an operation for inspecting the wafer W in the inspection unit U3. As a result of inspection in the inspection unit U3, the image data and the spectrum data are acquired.

The image data retaining unit 102 functions to acquire and retain the image data of the surface of the wafer W imaged by the imaging unit 33 of the inspection unit U3. The image data retained in the image data retaining unit 102 is used to estimate the film thickness of the film formed on the wafer W. Further, the image data may be used to evaluate the film formation status rather than the film thickness of the film depending on the film thickness of the film formed on the wafer W. This will be described later in detail.

The spectroscopic measurement result retaining unit 103 functions to acquire the spectrum data of the surface of the wafer W from the spectrometer 43 of the inspection unit U3 and retain the spectrum data. The spectrum data retained in the spectroscopic measurement result retaining unit 103 is used to estimate the film thickness of the film formed on the wafer W.

The film thickness calculation unit 104 functions to calculate the film thickness of the film formed on the wafer W based on the image data retained in the image data retaining unit 102 and the spectrum data retained in the spectroscopic measurement result retaining unit 103. The sequence of calculating the film thickness will be described later in detail.

The determination unit 105 functions to determine whether the film thickness calculated by the film thickness calculation unit 104 is appropriate. Since film formation is performed in the coating unit U1 and the heat treatment unit U2 located at the upstream side of the inspection unit U3, this determination corresponds to the determination of whether the coating unit U1 and the heat treatment unit U2 are appropriately operated.

The detailed inspection unit 106 functions to perform a detailed inspection to check operations of the coating unit U1 and the heat treatment unit U2 when the determination unit 105 determines that there is a problem with the film thickness. In the detailed inspection which will be described later in detail, a bare wafer on which a pattern is not formed is prepared as a wafer for inspection and a film is formed on the bare wafer to evaluate the film thickness thereof.

The model creation unit 107 and the model retaining unit 108 function to create a model to be used for calculating the film thickness from the image data and retain the model. Color information of the surface of the wafer W can be acquired from the image data imaged by the inspection unit U3. Therefore, the model creation unit 107 creates a model capable of estimating the film thickness based on the color information of the surface of the wafer W, and the model retaining unit 108 retains the created model. The film thickness calculation unit 104 estimates the film thickness of the wafer W to be inspected by using the model.

The spectroscopic information retaining unit 109 functions to retain spectroscopic information to be used for calculating the film thickness from the spectrum data. The spectrum data acquired by the inspection unit U3 varies depending on the kind and the film thickness of the film formed on the surface of the wafer W. Therefore, the spectroscopic information retaining unit 109 retains information indicative of the correlation between the film thickness and the spectrum. The film thickness calculation unit 104 estimates the film thickness of the wafer W to be inspected (target substrate) based on the information retained in the spectroscopic information retaining unit 109.

Figure 5:
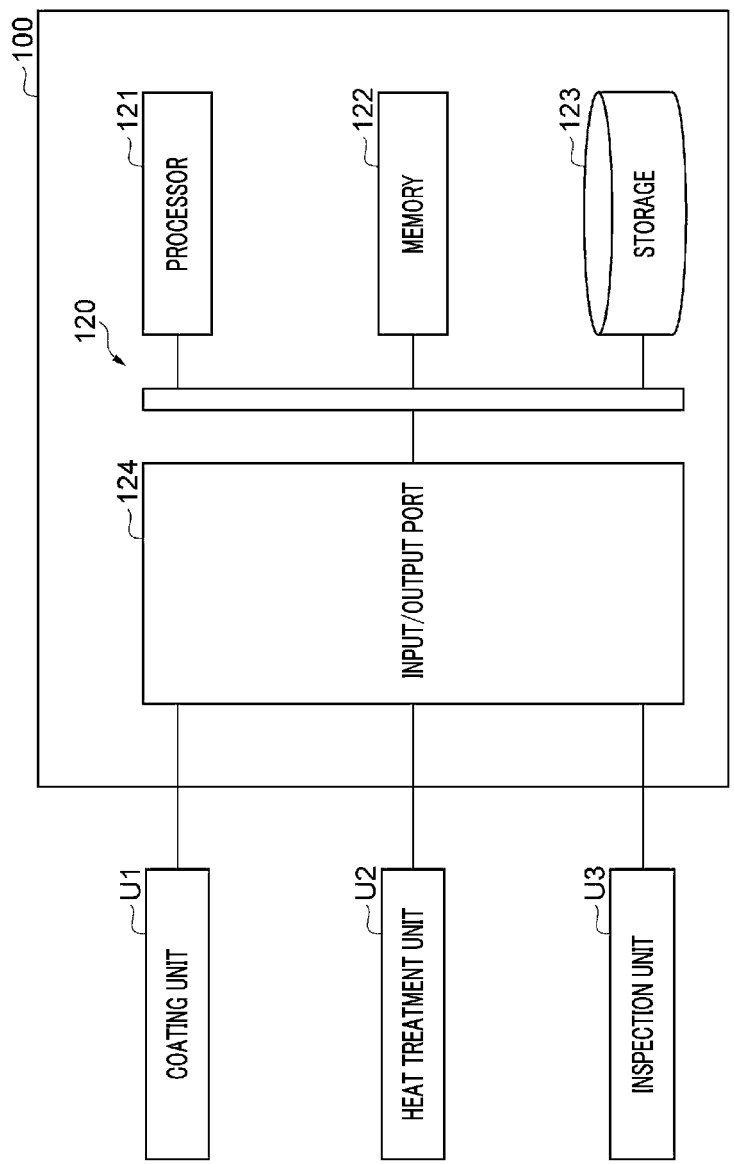
FIG. 5 is a block diagram illustrating an example of a hardware configuration of the control device.

The control device 100 is composed of one or more control computers. For example, the control device 100 has a circuit 120 illustrated in FIG. 5. The circuit 120 includes one or more processors 121, a memory 122, a storage 123 and an input/output port 124. The storage 123 has a computer-readable recording medium such as a hard disk or the like. The recording medium stores programs for executing a processing sequence to be described later by the control device 100. The recording medium may be implemented by a portable medium such as a non-volatile semiconductor memory, a magnetic disk or an optical disk. The memory 122 temporarily stores thereon the programs loaded from the recording medium of the storage 123 and an operation result by the processor 121. The processors 121 constitute the above-described individual functional modules by executing the programs in cooperation with the memory 122. The input/output port 124 is configured to perform an input and an output of electric signals with respect to a control target member in response to instructions from the processor 121.

The hardware configuration of the control device 100 is not necessarily limited to constituting the individual functional modules by the programs. For example, the individual functional modules of the control device 100 may be composed of exclusive logical circuits or an ASIC (Application Specific Integrated Circuit) in which these logical circuits are integrated.

Also, FIG. 4 and the following exemplary embodiment illustrate that the above-described components are included in the control device 100, but the control device 100 may not have all the above-described functions. For example, a model management unit 110 including the model creation unit 107 and the model retaining unit 108 or only the model creation unit 107 may be provided in an external device. In other words, these functions may be provided in a device provided separately from the control device 100 controlling, for example, the coating/developing apparatus 2. As such, if the function for creating the model is provided in an external device provided separately from the control device 100, the function to be described in the following exemplary embodiment is performed by the external device in cooperation with the control device 100. Further, in this case, the external device equipped with the function corresponding to the control device 100 described in the present exemplary embodiment and the substrate processing apparatus described in the present exemplary embodiment may integrally function as a substrate inspection system.

[Processing Sequence]

Then, a sequence of processing performed in the coating/developing apparatus 2 will be described as an example of the coating/developing processing.

According to the processing sequence, the control device 100 first controls the transfer device A1 to transfer the wafer W, serving as the processing target, in the carrier C to the shelf unit U10 and controls the transfer device A7 to place the wafer W in the cell for the processing module 11.

Then, the control device 100 controls the transfer device A3 to transfer the wafer W in the shelf unit U10 to the coating unit U1 and the heat treatment unit U2 within the processing module 11. Also, the control device 100 controls the coating unit U1 and the heat treatment unit U2 to form the underlying film on the surface of the wafer W. Further, after the underlying film is formed, the control device 100 controls the transfer device A3 to transfer the wafer W to the inspection unit U3, and may inspect the surface status of the wafer W by the inspection unit U3. Then, the control device 100 controls the transfer device A3 to return the wafer W on which the underlying film is formed to the shelf unit U10 and controls the transfer device A7 to place the wafer W in the cell for the processing module 12.

Then, the control device 100 controls the transfer device A3 to transfer the wafer W in the shelf unit U10 to the coating unit U1 and the heat treatment unit U2 within the processing module 12. Also, the control device 100 controls the coating unit U1 and the heat treatment unit U2 to form the intermediate film on the underlying film of the wafer W. For example, the control device 100 controls the coating unit U1 to form the intermediate film by coating the processing liquid for forming the intermediate film on the underlying film of the wafer W. Then, the control device 100 controls the heat treatment unit U2 to perform the heating processing on the intermediate film. After the intermediate film is formed, the control device 100 controls the transfer device A3 to transfer the wafer W to the inspection unit U3, and may inspect the surface status of the wafer W by the inspection unit U3. Then, the control device 100 controls the transfer device A3 to return the wafer W to the shelf unit U10 and controls the transfer device A7 to place the wafer W in the cell for the processing module 13.

Thereafter, the control device 100 controls the transfer device A3 to transfer the wafer W in the shelf unit U10 to each unit within the processing module 13 and also controls the coating unit U1 and the heat treatment unit U2 to form the resist film on the intermediate film of the wafer W. For example, the control device 100 controls the coating unit U1 to form the resist film by coating the processing liquid for forming the resist film on the intermediate film of the wafer W. Then, the control device 100 controls the heat treatment unit U2 to perform the heating processing on the resist film. After the resist film is formed, the control device 100 controls the transfer device A3 to transfer the wafer W to the inspection unit U3, and may inspect the surface status of the wafer W (e.g., the film thickness of an upper film) by the inspection unit U3. Then, the control device 100 controls the transfer device A3 to return the wafer W to the shelf unit U11.

Thereafter, the control device 100 controls the transfer device A8 to transfer the wafer W in the shelf unit U11 to the exposure apparatus 3. Then, the control device 100 receives the wafer W to which the exposure processing is performed from the exposure apparatus 3 and controls the transfer device A8 to place the wafer W in the cell for the processing module 14 in the shelf unit U11.

Thereafter, the control device 100 controls the transfer device A3 to transfer the wafer W in the shelf unit U11 to each unit within the processing module 14 and also controls the coating unit U1 and the heat treatment unit U2 to perform the developing processing on the resist film R of the wafer W. Then, the control device 100 controls the transfer device A3 to return the wafer W back to the shelf unit U10, and controls the transfer device A7 and the transfer device A1 to return the wafer W back into the carrier C. Thus, the processing sequence is completed.

[Substrate Inspection Method]

Hereinafter, a substrate inspection method performed in the processing modules 11 to 13 under the control of the control device 100 will be described with reference to FIG. 6 to FIG. 11. The substrate inspection method is a method of inspecting the wafer W, on which the film has been formed, in the inspection unit U3 provided in the processing modules 11 to 13. The inspection unit U3 inspects whether a desired film is formed on the wafer W on which the film has been formed. Specifically, the inspection unit U3 evaluates the surface status and the film thickness of the film formed on the wafer W. The inspection unit U3 includes, for example, the imaging unit 33 and the spectrum measurement unit 40 as described above. Therefore, the image data of the surface of the wafer W can be acquired by the imaging unit 33 and the spectrum data of the surface of the wafer W can be acquired by the spectrum measurement unit 40. The control device 100 evaluates the film formation status based on these data. Also, for the purpose of evaluation of the film formation status on the wafer W, the control device 100 may perform the inspection by the inspection units U3 after the underlying film, the intermediate film and the resist film are formed in the processing modules 11 to 13, respectively.

Figure 6:
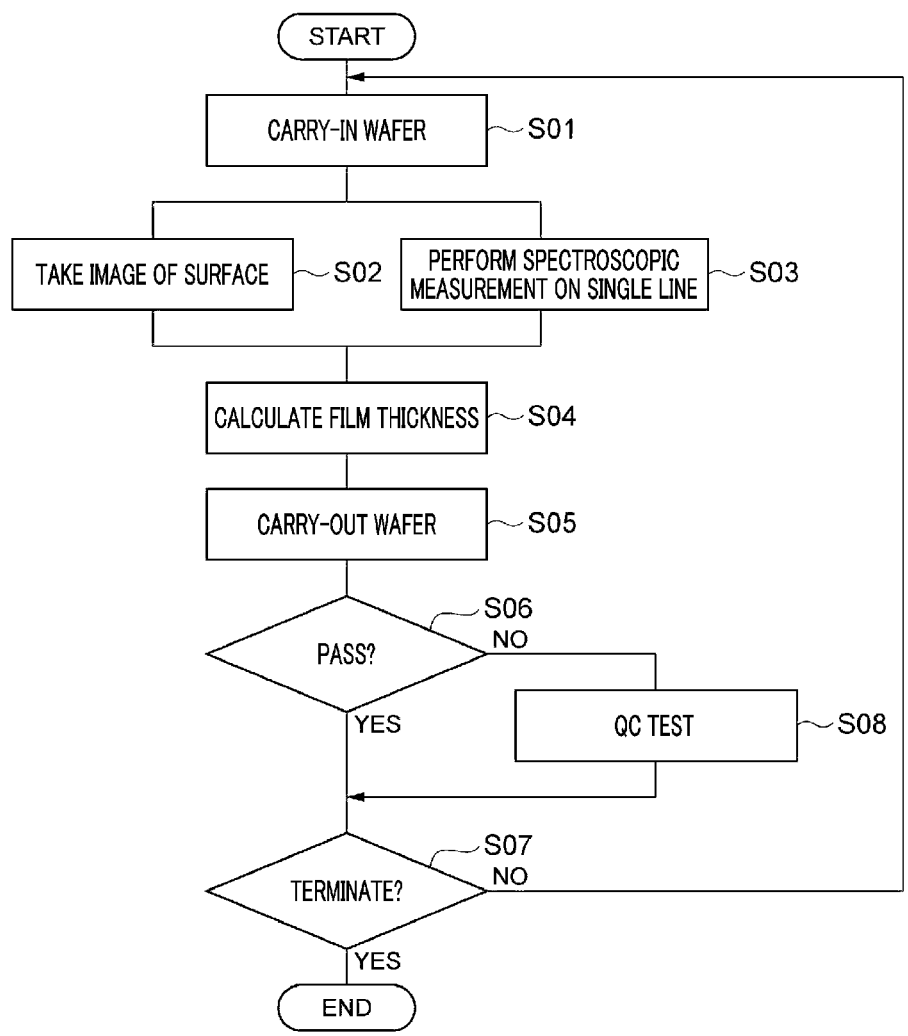
FIG. 6 is a flowchart showing an example of a control (wafer inspection) by the control device.

FIG. 6 is a flowchart provided to explain a sequential flow of the substrate inspection method in the inspection unit U3. First, the control device 100 performs a process S01. In the process S01, the wafer W, on which the film formation has been performed in the coating unit U1 and the heat treatment unit U2, is carried into the inspection unit U3. The wafer W is held on the holder 31.

Then, the inspection unit 101 of the control device 100 performs a process S02 (image acquisition process). In the process S02, the surface of the wafer W is imaged by the imaging unit 33. Specifically, the surface of the wafer W is imaged by the imaging unit 33 while the holder 31 is moved in a predetermined direction by driving the linear driver 32. Thus, the imaging unit 33 acquires the image data of the surface of the wafer W. The image data is retained in the image data retaining unit 102 of the control device 100.

Figure 7:
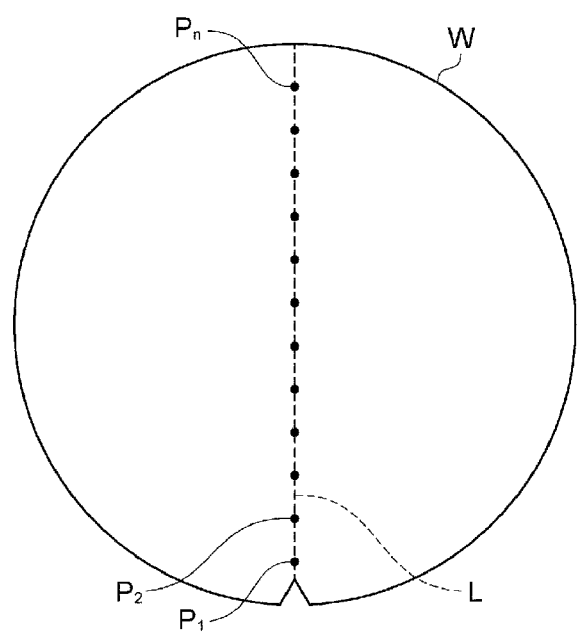
FIG. 7 is a view illustrating an example of an acquisition position of spectrum data.

Further, the inspection unit 101 of the control device 100 performs a process S03 (spectroscopic measurement process) concurrently with the process S02. In the process S03, the spectrum measurement unit 40 performs spectroscopic measurement on a single line on the surface of the wafer W. As described above, the light receiving unit 41 of the spectrum measurement unit 40 is provided on a path through which the center of the wafer W held on the holder 31 passes when the holder 31 is moved. Thus, it is possible to acquire a spectrum from each position along the diametric direction of the wafer W including the central portion of the wafer W. Therefore, as illustrated in FIG. 7, light reflected from the surface of the wafer W along a center line L passing through the center of the wafer W is projected on the light receiving unit 41. The spectrometer 43 measures a spectrum of the light which is projected at a predetermined interval. As a result, the spectrometer 43 acquires the spectrum data corresponding to positions along the center line L, for example, n number of positions $P_1$ to $P_n$ as illustrated in FIG. 7. As such, the spectrometer 43 is used for acquiring the spectrum data of the surface of the wafer W from the positions along the center line L of the wafer W. Further, n can be appropriately changed depending on the interval of the spectroscopic measurement by the spectrometer 43 and the speed of the movement of the wafer W by the holder 31. The spectrum data acquired by the spectrometer 43 is retained in the spectroscopic measurement result retaining unit 103 of the control device 100.

The film thickness calculation unit 104 of the control device 100 performs a process S04. In the process S04, the film thickness of the film on the surface of the wafer W is calculated on the basis of the image data of the surface of the wafer W and the spectrum data acquired by the spectroscopic measurement.

The sequence of the processing of calculating the film thickness by using the image data will be described with reference to FIG. 8. For the calculation of the film thickness using the image data, the film thickness model created by the model creation unit 107 and retained in the model retaining unit 108 is used. The film thickness model is a model for calculating the film thickness based on the information about the color change (color change before and after the formation of a predetermined film) from the image data of the surface of the wafer W at the time of forming the predetermined film and shows the correlation between the information about the color change and the film thickness. The film thickness model is created in advance by the model creation unit 107 of the control device 100 and retained in the model retaining unit 108 to acquire the information about the color change from each position in the image data. Therefore, it is possible to estimate the film thickness based on the color change. In the film thickness model creating method which will be described later in detail, the surface of the wafer W on which various processings have been performed in the previous stage and the surface of the wafer W on which the predetermined film has been further formed are imaged to acquire the image data and specify how the color has changed. Also, the film thickness of the wafer on which the film has been formed under the same conditions is measured. Thus, it is possible to specify the correlation between the film thickness and the color change. By repeating this measurement while changing the film thickness, the correlation between the information about the color change and the film thickness can be acquired.

Figure 8:
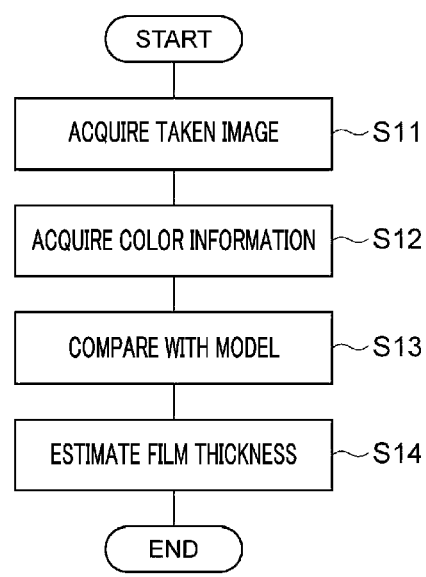
FIG. 8 is a flowchart showing an example of a control (estimation of film thickness based on color change) by the control device.

The method of calculating the film thickness from the image data is performed as shown specifically in FIG. 8. First, the image data is acquired (process S11) and the information about the color change for each pixel is acquired from the image data (process S12). To acquire the information about the color change, a difference from the image data acquired before the film formation may be calculated. Then, the acquired information is compared with the film thickness model retained in the model retaining unit 108 (process S13). Thus, the film thickness on the imaged region for each pixel can be estimated (process S14). Therefore, it is possible to estimate the film thickness for each pixel, i.e., at each position on the surface of the wafer W.

The calculation (estimation) of the film thickness based on the image data is applicable to a case where the film formed on the wafer W has a relatively small thickness (e.g., about 500 nm or less) but is difficult in a case where the film thickness of the film increases. This is because as the film thickness increases, the color change caused by the change in the film thickness decreases, and, thus, it is difficult to precisely estimate the film thickness based on the information about the color change. Therefore, if the film having a large film thickness is formed, the film thickness is estimated based on the spectrum data.

The sequence of the processing for calculating the film thickness by using the spectrum data will be described with reference to FIG. 9. For the calculation of the film thickness using the spectrum data, a change in reflectivity depending on the film thickness of the film is used. When the light is irradiated to the wafer on which the film has been formed, the light may be reflected from the surface of the uppermost film or reflected from the interface between the uppermost film and its underlayer (film or wafer). Then, the light is emitted as reflection light. That is, the reflection light has two light components different in phase from each other. Also, as the film thickness on the surface increases, the phase difference increases. Therefore, when the film thickness changes, the degree of interference between the light reflected from the film surface and the light reflected from the interface between the film and the underlayer changes. That is, a shape of a spectrum of the reflection light changes. A change in a spectrum depending on the film thickness can be theoretically calculated. Therefore, the control device 100 previously stores information about the shape of the spectrum depending on the film thickness of the film formed on the surface. Also, the control device 100 compares the spectrum of the reflection light actually obtained by irradiating the light to the wafer W with the information stored therein. Thus, it is possible to estimate the film thickness of the film on the surface of the wafer W. Information about the correlation between the film thickness and the spectrum shape to be used for estimating the film thickness is retained in the spectroscopic information retaining unit 109 of the control device 100.

Figure 9:
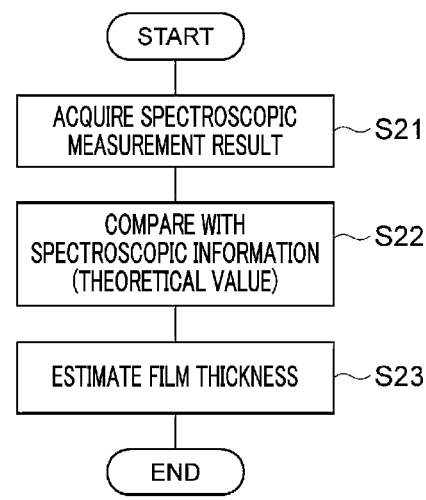
FIG. 9 is a flowchart showing an example of a control (estimation of film thickness based on spectrum data) by the control device.

The method of calculating the film thickness from the spectrum data is performed as shown specifically in FIG. 9. First, the spectroscopic measurement result, i.e., the spectrum data is acquired (process S21) and then compared with the information retained in the spectroscopic information retaining unit 109, i.e., the theoretical information about the shape of the spectrum corresponding to the film thickness (process S22). Thus, the film thickness on a region where the spectrum data has been acquired can be estimated (process S23). Therefore, it is possible to estimate the film thickness for the spectrum data, i.e., at each position on the surface of the wafer W. As described above, the spectrum data can be obtained from the positions along the center line L on the single wafer W, and, thus, it is possible to acquire information about the distribution of the film thickness on the surface of the wafer W by calculating the film thickness based on the spectrum data.

The image data of the wafer W imaged by the imaging unit 33 are data in which the entire surface of the wafer W is imaged. Therefore, it is possible to estimate the film thickness on the entire surface of the wafer W from the image data. Meanwhile, when the film thickness is estimated based on the spectrum data acquired by the spectrum measurement unit 40, the positions to acquire the spectrum data are limited on the center line L of the wafer W. Therefore, when the film thickness of the film on the surface of the wafer W is estimated based on the spectrum data, it is difficult to evaluate the overall distribution of the film thickness compared with the estimation of the film thickness based on the image data. However, it is possible to estimate the film thickness at the positions along the center line L just by performing the spectroscopic measurement on the single line. Therefore, it is assumed that if the in-plane distribution of the film thickness of the film formed on the surface of the wafer W is abnormal, it is possible to detect a certain change such as non-uniformity in the film thickness estimated from the spectrum data.

As described above, the estimation of the film thickness based on the image data is limited to the case where the film formed on the wafer W is thin to some extent. Meanwhile, the estimation of the film thickness based on the spectrum data is possible in a case where the film formed on the wafer W is thick to some extent and in a case where the film has a small film thickness (e.g., several tens nm). As such, the estimation of the film thickness based on the spectrum data is not limited by the thickness of the wafer W and thus assumed highly versatile. However, the wafer W has a predetermined pattern thereon. For this reason, the spectrum data affected by protrusions or recesses in the pattern may be acquired. Therefore, the spectrum data acquired from the wafer W may not accurately reflect the film thickness of the film formed on the wafer W. Therefore, it is necessary to handle the spectrum data in consideration of this matter. Also, it is necessary to consider the possibility of inaccuracy of the film thickness estimated based on the spectrum data. However, this problem can be solved as long as the positions to acquire the spectrum data are specified more precisely. That is, when the spectrum is acquired from the surface of the wafer W having the pattern thereon, if it is possible to acquire the spectrum data from a position different from a position where a step has been formed, it is possible to suppress a decrease in precision caused by the pattern.

If the film thickness is estimated based on the spectrum data, the image data may be used, for example, to evaluate the film formation status. The evaluation of the film formation status is to check whether there is any abnormality detected from the image data, such as a defect, e.g., a spot, on the surface of the film. Therefore, by acquiring both the image data and the spectrum data, the film formation status can be evaluated in more detail. For example, if a defect in a partial region on the center line L of the wafer W, which is a target to acquire the spectrum data, is detected from the image data, the spectrum data of a position overlapping or adjacent to the region is specified and not used to calculate the mean value during the estimation of the film thickness. Therefore, it is possible to increase the precision of the estimated value. Also, the image of the defective region and the estimated film thickness based on the spectrum data of the corresponding position may be automatically stored in association with each other. Thus, it is possible to simply and securely extract depth-direction information of the defective planar region. Therefore, it is possible to achieve high efficiency and high precision, for example, in analyzing the status and the cause of the defect later. As such, the film formation status on the surface of the substrate can be evaluated based on the image data. Thus, the spectrum data can be widely applied depending on the film formation status acquired from the image data.

If the film thickness is estimated based on the image data, the process of acquiring the spectrum data (process S03) may be omitted. In this case, the estimation of the film thickness and the evaluation of the film formation status may be performed based on the image data only without acquiring the spectrum data by the spectrum measurement unit 40.

Returning to FIG. 6 again, the inspection unit 101 of the control device 100 performs a process S05 (determination process) after the calculation of the film thickness (process S04). In the process S05, the wafer W is carried out from the inspection unit U3. The carried-out wafer W is transferred to, for example, a processing module located at the downstream side.

Then, the determination unit 105 of the control device 100 performs a process S06. In the process S06, the determination unit 105 checks whether the film thickness of the wafer W meets pass criteria. Herein, the pass criteria are based on whether the film thickness of the entire wafer W is included in a predetermined range of the film thickness. That is, the process S06 is a process of evaluating whether the film formation has been performed appropriately in the coating unit U1 and the heat treatment unit U2 located at the upstream side.

Figure 10:
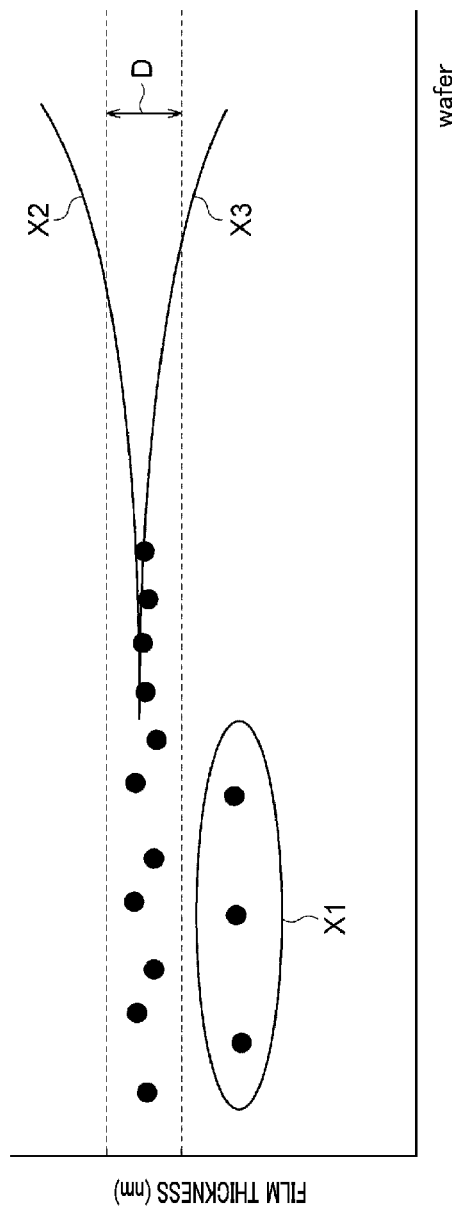
FIG. 10 is a diagram showing an example of determination of pass or fail.

The pass criteria for the film thickness in the process S06 will be described with reference to FIG. 10. The film to be formed on the wafer W has a set value (set range) of the film thickness. FIG. 10 illustrates a set range D of the film thickness and time-sequentially shows estimation results of the film thickness of the wafers W by dots, respectively. As described above, the film thickness at the positions on the surface of the single wafer W can be estimated based on any one of the image data and the spectrum data. Suppose that FIG. 10 shows the estimation results of the mean value of the film thickness at the positions on the single wafer W. Herein, an example where a single wafer of one lot (25 wafers) on which the same substrate processing has been performed is sampled for the estimation is illustrated. However, the present disclosure is not limited thereto. For example, the single wafer may be sampled per ten wafers or per hour.

Herein, if the estimation results of the film thickness at all of positions of the plurality of wafers W processed time-sequentially are included in the set range D, the wafers W may be determined as passed. Meanwhile, if there are estimation results of the film thickness out of the set range D as indicated by X1 in FIG. 10, it is determined that they don't meet the pass criteria. Also, the deviation of the film thickness may be considered as the pass criteria. For example, if the film thickness is estimated based on the spectrum data, the estimation results of the film thickness of the wafers W processed time-sequentially are may be changed to gradually deviate from the set range D as indicated by a solid line X2 or X3 in FIG. 10. In this case, even though the estimation results of the film thickness of the wafers W are included in the set range D at this point, it is assumed that the film thickness can deviate from the set range D later. For this reason, the wafers W may be determined as failed and may undergo the detailed inspection (QC test to be described later) depending on the apparatus. As such, the criteria (pass criteria) for determination of pass or fail of the film thickness in the process S06 may be appropriately changed according to a time-sequential change.

If the film thickness is determined as passed (S06—YES), the inspection unit 101 of the control device 100 performs a process S07. In the process S07, the inspection unit 101 determines whether or not to inspect a subsequent wafer W and terminates the inspection (S07—YES) or starts the inspection of the subsequent wafer W (S07—NO).

If the film thickness is determined as failed (S06—NO), the control device 100 determines to perform a detailed inspection and the detailed inspection unit 106 performs a process S08. The process S08 is a detailed inspection (QC test) on the film thickness.

The detailed inspection uses a bare wafer (on which a pattern has not been formed) which is called QC wafer (substrate for inspection). In the detailed inspection, the QC wafer is carried into the coating unit U1 and the heat treatment unit U2 and the film is formed on the QC wafer under the same conditions as on the typical wafer, and then, the film thickness of the film is evaluated in the inspection unit U3 in more detail than that of the typical wafer. The detailed inspection is particularly useful in a case where the film thickness of the typical wafer W is estimated using the spectrum data. When the typical wafer W is inspected, if the film thickness is evaluated using the spectrum data, the distribution of the film thickness throughout the entire surface of the typical wafer W is not evaluated. Therefore, if the wafer W is determined as failed in the determination of pass or fail (process S06), it is necessary to figure out the film thickness on a region whose film thickness has not been estimated. The detailed inspection corresponds to this inspection.

Figure 11:
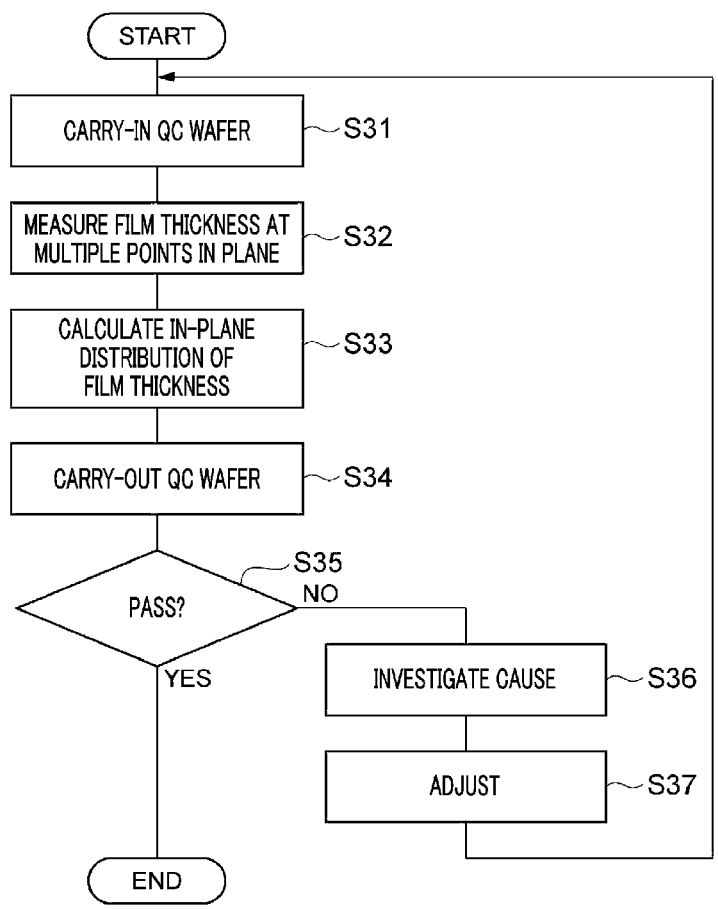
FIG. 11 is a flowchart showing an example of a control (detailed inspection) by the control device.

The sequence of the detailed inspection will be described with reference to FIG. 11. First, the detailed inspection unit 106 of the control device 100 performs a process S31. In the process S31, the QC wafer on which the film formation has been completed in the coating unit U1 and the heat treatment unit U2 is carried into the inspection unit U3. That is, after the film is formed on the QC wafer under the same conditions as on the wafer W which is the target substrate (film formation process), the QC wafer is carried into the inspection unit U3. The carried-in QC wafer is held on the holder 31.

Then, the detailed inspection unit 106 of the control device 100 performs a process S32 (detailed measurement process). In the process S32, the film thickness is measured at various positions in the plane. When the film thickness is measured, the spectrum data is acquired from a plurality of points. The points to measure the film thickness are dispersed throughout the entire surface of the QC wafer. As for the typical wafer W, the spectrum data is acquired at the same time when the image data is acquired. Therefore, the spectrum data is acquired along the center line L of the wafer W according to the movement of the holder 31 in one direction. In this regard, when the film thickness is measured at the points in the plane, the holder 31 is moved while changing the direction of the QC wafer held by the holder 31. Thus, the inspection unit U3 can acquire the spectrum data from various measurement positions two-dimensionally dispersed on the surface of the wafer.

When the spectrum data is acquired, the film thickness calculation unit 104 of the control device 100 performs a process S33 (detailed measurement process). In the process S33, the film thickness calculation unit 104 calculates the film thickness of the film on the surface of the wafer W based on each of the spectrum data of the surface of the wafer W and calculates the distribution of the film thickness in the plane. The sequence of calculating the film thickness using the spectrum data may be the same as the sequence of calculating the film thickness of the typical wafer W, as illustrated specifically in FIG. 9.

After the calculation of the film thickness distribution (process S33), the detailed inspection unit 106 of the control device 100 performs a process S34. In the process S34, the QC wafer is carried out from the inspection unit U3. The carried-out wafer W is transferred to, for example, a processing module located at the downstream side.

Then, the determination unit 105 of the control device 100 performs a process S35. In the process S35, the determination unit 105 checks whether the film thickness of the wafer W meets the pass criteria. Herein, the pass criteria are based on whether the film thickness distribution measured from the surface of the QC wafer is included in the set range of the film thickness. That is, the process S35 is a process of evaluating whether the film formation has been performed appropriately on the entire surface of the wafer in the coating unit U1 and the heat treatment unit U2 located at the upstream side.

If the film thickness distribution is determined as passed (S35—YES), the detailed inspection unit 106 of the control device 100 terminates a series of processings. If the film thickness distribution is determined as failed (S35—NO), the detailed inspection unit 106 of the control device 100 notifies an operator that the film formation has not been performed appropriately, for example, by outputting an error message. Then, the detailed inspection unit 106 investigates the cause of the inappropriate film formation (process S36) and makes an adjustment according to the cause (process S37). Then, the QC wafer is carried in again (process S31) to undergo a series of detailed inspection. The investigation of the cause (process S37) and the adjustment (process S38) may be performed autonomously by the control device 100. Otherwise, the control device 100 may only notify the error and the operator of the control device 100 (substrate processing system 1) may manipulate the control device 100 to perform these processes.

The detailed inspection (QC test) is performed repeatedly until the in-plane distribution of the film thickness on the surface of the wafer is determined as passed (process S35). In other words, if it is determined as passed in the determination of pass or fail (process S35), the film formation on the typical wafer W may be resumed. That is, as illustrated in FIG. 6, if the processing is not ended (S07—NO), the typical wafer W may be carried in to resume the inspection.

[Method of Creating Model Used in Substrate Inspection Method]

Hereinafter, a method of creating a model (film thickness model) used in the substrate inspection method by the control device 100 will be described with reference to FIG. 12 and FIG. 13. As described above, the film thickness model shows the correlation between the film thickness and the color information of the image data. Therefore, as for the wafer W whose film thickness is already known, the correlation between the film thickness and the color information can be acquired by specifying the color information of the image data acquired by imaging the wafer W. In order to accurately measure the film thickness of the wafer Won which the film formation has been performed, it is necessary to measure the film thickness of the wafer (bare wafer), on which the pattern has not been formed but the film formation has been performed, by cross section measurement or the like.

Therefore, the film thickness information and the color information to be used in the film thickness model are acquired using the bare wafer (substrate for color information), on which the pattern has not been formed, to be used for acquiring the color information and the bare wafer (substrate for film thickness measurement), on which the pattern has not been formed, to be used for measuring the film thickness.

A method of acquiring the color information using the bare wafer as the substrate for color information while creating the model by the control device 100 will be described with reference to FIG. 12.

First, the model creation unit 107 of the control device 100 performs a process S41. In the process S41, the substrate for color information is prepared. As described above, the bare wafer is prepared as the substrate for color information. Also, in this process, the bare wafer used as the substrate for color information is imaged in the inspection unit U3 to acquire the image data of the substrate before the film formation. The acquired image data is used for acquiring the color information of the surface of the wafer after the underlying film is formed.

Thereafter, the model creation unit 107 of the control device 100 performs a process S42. In the process S42, the underlying film is formed on the prepared substrate for color information by controlling each unit of the processing module 11. Herein, the underlying film is formed according to predetermined settings.

Then, the model creation unit 107 of the control device 100 performs a process S43. In the process S43, the image data of the surface of the substrate for color information on which the underlying film has been formed is acquired by controlling the inspection unit U3 of the processing module 11. The acquired image data is used for acquiring the color information of the surface of the wafer after the underlying film is formed.

Thereafter, the model creation unit 107 of the control device 100 performs a process S44. In the process S44, the intermediate film is formed on the underlying film of the substrate for color information by controlling each unit of the processing module 12. Herein, the intermediate film is formed according to predetermined settings.

Then, the model creation unit 107 of the control device 100 performs a process S45. In the process S45, the image data of the surface of the substrate for color information on which the intermediate film has been formed is acquired by controlling the inspection unit U3 of the processing module 12. The acquired image data is used for acquiring the color information of the surface of the wafer after the intermediate film is formed.

Thereafter, the model creation unit 107 of the control device 100 performs a process S46. In the process S46, the resist film is formed on the intermediate film of the substrate for color information by controlling each unit of the processing module 13. Herein, the resist film is formed according to predetermined settings.

Then, the model creation unit 107 of the control device 100 performs a process S47. In the process S47, the image data of the surface of the substrate for color information on which the resist film has been formed is acquired by controlling the inspection unit U3 of the processing module 13. The acquired image data is used for acquiring the color information of the surface of the wafer after the resist film is formed.

As for the substrate for color information, the formation of the underlying film, the intermediate film and the resist film is performed in the same manner as in the substrate processing of the actual wafer W, and the image data is acquired whenever each film is formed. Thus, it is possible to acquire the image data of the surface of the substrate for color information prepared under the same conditions as in the film formation on the wafer W.

Hereinafter, a method of acquiring film thickness information using a substrate for film thickness measurement while creating the model by the control device 100 will be described with reference to FIG. 13. The substrate for film thickness measurement is used for accurately calculating the film thickness of the film formed on the wafer on which the film formation has been performed under predetermined conditions. Therefore, in order to form three kinds of films, i.e., the underlying film, the intermediate film and the resist film on the wafer, the bare wafer on which another film has not been formed as the base layer is used whenever each film is formed. Thus, film thickness can be measured accurately without being affected by a subtle change in the film thickness, which would be caused by the formation of another film as the base layer.

First, the model creation unit 107 of the control device 100 performs a process S51. In the process S51, the substrate for film thickness measurement is prepared. The substrate for film thickness measurement is the wafer on which the pattern has not been formed. A plurality of substrates for film thickness measurement is prepared depending on the number of films to be formed.

Thereafter, the model creation unit 107 of the control device 100 performs a process S52. In the process S52, the underlying film is formed on the prepared substrate for film thickness measurement by controlling each unit of the processing module 11. Herein, the underlying film is formed according to the same settings (predetermined settings) as on the substrate for color information.

Then, the model creation unit 107 of the control device 100 performs a process S53. In the process S53, the image data of the surface of the substrate for film thickness measurement on which the underlying film has been formed is acquired by controlling the inspection unit U3 of the processing module 11. The acquired image data of the bare wafer may be used for creating a model for color information of the surface of the wafer after the underlying film is formed.

Thereafter, the model creation unit 107 of the control device 100 performs a process S54. In the process S54, the intermediate film is formed on substrate for film thickness measurement by controlling each unit of the processing module 12. Herein, the intermediate film is formed according to the same settings (predetermined settings) as on the substrate for color information. However, unlike the substrate for color information, the film formation is performed on the bare wafer on which the film formation has not been performed.

Then, the model creation unit 107 of the control device 100 performs a process S55. In the process S55, the image data of the surface of the substrate for film thickness measurement on which the intermediate film has been formed is acquired by controlling the inspection unit U3 of the processing module 12. The acquired image data may be used for creating the model for color information of the surface of the wafer after the intermediate film is formed.

Thereafter, the model creation unit 107 of the control device 100 performs a process S56. In the process S56, the resist film is formed on the substrate for film thickness measurement by controlling each unit of the processing module 13. Herein, the resist film is formed according to the same settings (predetermined settings) as on the substrate for color information. However, unlike the substrate for color information, the film formation is performed on the bare wafer on which the film formation has not been performed.

Then, the model creation unit 107 of the control device 100 performs a process S57. In the process S57, the image data of the surface of the substrate for film thickness measurement on which the resist film has been formed is acquired by controlling the inspection unit U3 of the processing module 13. The acquired image data may be used for creating the model for color information of the surface of the wafer after the resist film is formed.

As for the substrate for film thickness measurement, the formation of the underlying film, the intermediate film and the resist film which are formed on the actual wafer is performed on the bare wafers different from each other. For this reason, a plurality of substrates for film thickness measurement is prepared depending on the number of films to be formed.

Thereafter, the model creation unit 107 of the control device 100 performs a process S58. In the process S58, the film thickness measurement is performed on each of the substrate for film thickness measurement on which the underlying film has been formed, the substrate for film thickness measurement on which the intermediate film has been formed and the substrate for film thickness measurement on which the resist film has been formed. The film thickness measurement is performed by the above-described spectrum measurement unit 40. That is, as described above, the calculation of the film thickness using the spectrum data can be performed using the change in the reflectivity depending on the film thickness of the film on the surface. That is, the light reflected from the wafer and used for acquiring the spectrum data has light components different in phase from each other depending on the film thickness. With this reflected light, it is possible to specify the film thickness based on the change in shape of the spectrum. As described above, if a desired film is formed on the surface of the bare wafer used as the substrate for film thickness measurement, the lower surface of the film is flattened, and, thus, the shape of the spectrum reflects the film thickness of the film formed on the surface of the substrate for film thickness measurement. Therefore, it is possible to accurately calculate the film thickness from the spectrum data acquired by imaging the substrate for film thickness measurement on which the film has been formed. The calculation of the film thickness from the spectrum data is performed by the same method as described above with reference to FIG. 9.

Figure 12:
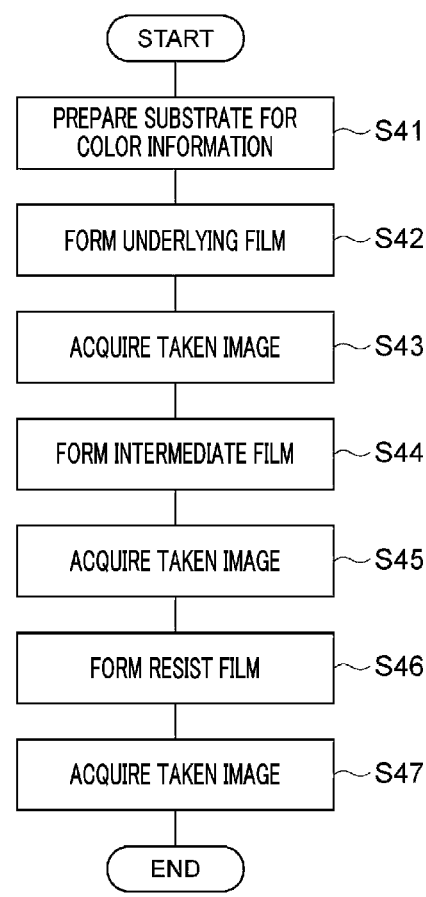
FIG. 12 is a flowchart showing an example of a control (processing of pattern wafer during model creation) by the control device.
Figure 13:
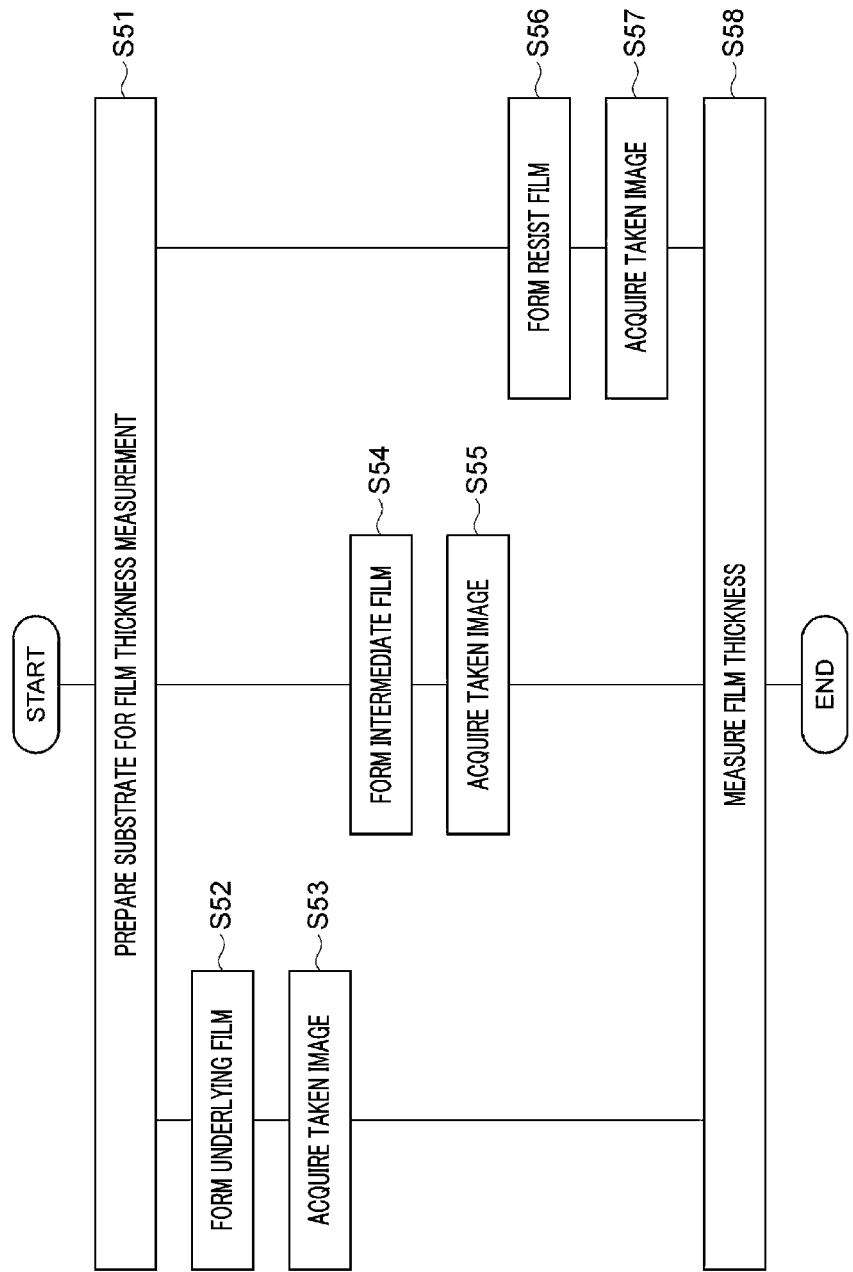
FIG. 13 is a flowchart showing an example of a control (processing of bare wafer during model creation) by the control device.
Figure 14:
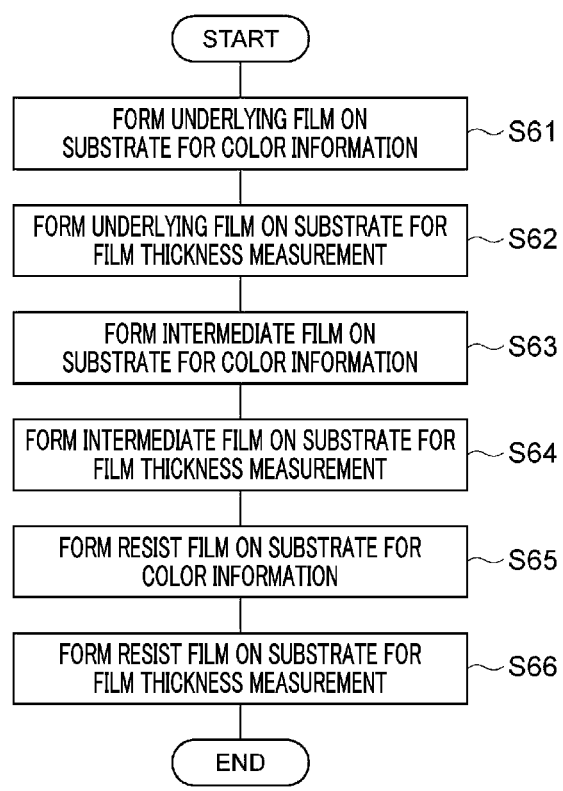
FIG. 14 is a flowchart showing an example of a control (processing of wafer during model creation) by the control device.

Through the processings described in FIG. 12 and FIG. 13, the image data in each process of the substrate for color information on which the film has been formed and the information specifying the film thickness at the time of forming the film on the substrate for film thickness measurement under the same conditions can be acquired. Further, to form the films on the substrate for color information and the substrate for film thickness measurement, respectively, under more similar conditions as described above, each film may be formed in the sequence illustrated, for example, in FIG. 14.

Specifically, first, while or after the underlying film is formed on the substrate for color information (process S61), the underlying film is formed on the substrate for film thickness measurement (process S62). Further, while or after the intermediate film is formed on the substrate for color information on which the underlying film has been formed (process S63), the intermediate film is formed on the substrate for film thickness measurement (process S64). Furthermore, while or after the resist film is formed on the substrate for color information on which the intermediate film has been formed (process S65), the resist film is formed on the substrate for film thickness measurement (process S66). As such, the timing of the film formation on the substrate for color information is made as close as possible to the timing of the film formation on the substrate for film thickness measurement, and, thus, the film formation can be performed to both the substrate for color information and the substrate for film thickness measurement under more similar conditions. Desirably, the timing of the film formation on the substrate for color information is close to the timing of film formation on the substrate for film thickness measurement. For example, after coating the processing liquid on the substrate for color information in the coating unit U1, coating the processing liquid on the substrate for film thickness measurement in the coating unit U1 is performed. Then, after heating the substrate for color information in the heat treatment unit U2, heating the substrate for film thickness measurement in the heat treatment unit U2 is performed. As such, by alternately processing the substrate for color information and the substrate for film thickness measurement in each unit, the timing of the film formation can be made close to each other.

Figure 15:
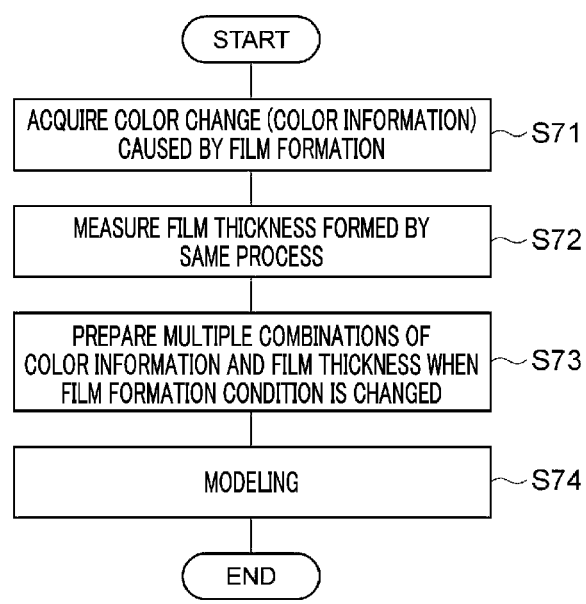
FIG. 15 is a flowchart showing an example of a control (model creation) by the control device.

The film thickness model can be created by combining the data acquired in the above-described sequence. The sequence of creating the film thickness model by the model creation unit 107 of the control device 100 will be described with further reference to FIG. 15.

First, information about color change caused by the film formation in each process can be acquired from the image data acquired by imaging the substrate for color information (process S71: imaging process). For example, when a model for the underlying film is created, the image data acquired by imaging the substrate for color information in the preparation process (process S41) is compared with the image data acquired by imaging the substrate for color information after the underlying film is formed (process S43). By this comparison, it is possible to specify how much the color of the surface has changed when the underlying film is formed. Meanwhile, by measuring the film thickness of the underlying film formed on the substrate for film thickness measurement under the same film formation conditions (process S58), the film thickness of the underlying film can be specified (process S72: film thickness measurement process). Thus, it can be seen that if the underlying film having a predetermined film thickness (e.g., 100 nm) is formed on the substrate for color information, such amount of color change is observed as the color information. A plurality of combinations of film thickness and color information is prepared for different film thicknesses (process S73: model creation process). That is, a plurality of combinations of film thickness and color information is prepared for film thicknesses (e.g., 90 nm, 95 nm, 100 nm and 110 nm) changed with change in film formation conditions. With such plurality of combinations, it is possible to specify the correlation indicating how color information changes according to the change in the film thickness. This is modeling of color change depending on the film thickness, and, thus, the film thickness model can be obtained (process S74: model creation process). Herein, the underlying film has been described as an example, but a film thickness model can also be created for each of the intermediate film and the resist film through the same sequence of processes.

Also, the bare wafer has been described as the substrate for color information, but the substrate for color information can be, for example, a pattern wafer on which a pattern corresponding to a target wafer W has been formed. In this case, it is assumed that color information acquired by imaging the substrate for color information is similar to that of the actual wafer W.

[Effects]

As described above, in the substrate processing apparatus according to the present exemplary embodiment, the inspection unit U3 includes the holder 31 configured to hold the substrate on which the film has been formed; the imaging unit 33 configured to acquire the image data by imaging the surface of the substrate held on the holder 31; and the spectrum measurement unit 40 configured to acquire spectroscopic data by separating the light from the surface of the substrate held on the holder 31 into the spectroscopic components.

As described above, the image data of the surface of the substrate can be acquired by imaging the surface of the substrate held on the holder 31 and the spectroscopic data of the light reflected from the surface of the substrate can be acquired. Thus, it is possible to precisely evaluate the film formed on the substrate.

Conventionally, the status of the film has been evaluated based on the image data acquired by imaging the surface of the substrate. However, there have been cases where the status of the film cannot be appropriately evaluated based on the image data only. Particularly, if the film having the large film thickness is formed on the surface of the substrate, the film formation status may not be precisely evaluated based on the image data only. In this regard, it can be considered that a new inspection unit for evaluating the status of the film is provided. However, in this case, the number of processings for evaluating the film may increase, resulting in the increase in the workload of the substrate processing. Therefore, as described above, the image data and the spectroscopic data are acquired in the inspection unit U3, and, thus, it is possible to precisely evaluate the film on the substrate without providing a new unit. Particularly, the evaluation using the spectroscopic data can be performed. Thus, as for the substrate on which the film has been formed to the film thickness difficult to evaluate based on the image data only, it is possible to precisely evaluate the film on the substrate.

Further, the imaging unit 33 may acquire the image of the entire surface of the substrate and the spectrum measurement unit 40 may acquire the spectroscopic data by separating the light from each of the different regions on the surface of the substrate into the spectroscopic components.

With this configuration, the information about the entire surface of the substrate can be acquired from the image data acquired by the imaging unit. Therefore, the entire surface of the substrate can be evaluated. Meanwhile, the spectrum measurement unit can acquire the spectroscopic data of different regions on the surface of the substrate. Therefore, the spectrum measurement unit can acquire the information about the spectroscopic characteristics at positions on the substrate. Thus, it is possible to perform the evaluation using non-uniformity in spectroscopic characteristics or the like. Accordingly, the film on the surface of the substrate can be multilaterally evaluated.

The substrate processing apparatus also includes the control device 100 as the controller configured to control the holder 31, the imaging unit 33 and the spectrum measurement unit 40, and the controller may control the imaging unit 33 to image the surface of the substrate while moving the holder 31 in one direction and also control the spectrum measurement unit 40 to acquire the spectroscopic data by separating the light from each of the different regions on the surface of the substrate into the spectroscopic components.

With this configuration, it is possible to concurrently acquire the image data by the imaging unit 33 while moving the holder 31 in one direction and the spectroscopic data by the spectrum measurement unit 40. Therefore, although the image data and the spectroscopic data are both acquired, the time required for acquiring them does not increase. Thus, the image data and the spectroscopic data can be acquired effectively.

Also, the control device 100 may evaluate the film formation status on the surface of the substrate based on the image data acquired by the imaging unit 33.

Since the film formation status on the surface of the substrate is evaluated based on the image data as described above, the handling of the spectroscopic data may be changed according to, for example, the evaluation result on the film formation status based on the image data. Therefore, the image data and the spectroscopic data for substrate inspection can be handled more appropriately.

The substrate inspection method according to the above-described exemplary embodiment is a method of inspecting the substrate on which the film has been formed and includes the image acquisition process of acquiring the image data by imaging the surface of the substrate held on the holder by the imaging unit; the spectroscopic measurement process of acquiring the spectroscopic data by separating the light from a partial region on the surface of the substrate held on the holder into the spectroscopic components by the spectrum measurement unit; the determination process of determining whether the film meets the pass criteria based on the image data and the spectroscopic data; the film formation process of performing the same film formation processing on the substrate for inspection as on the substrate if the film does not meet the pass criteria in the determination process; and the detailed measurement process of acquiring the spectroscopic data by separating the light from each of the measurement positions two-dimensionally dispersed on the surface of the film-formed substrate for inspection held on the holder into the spectroscopic components by the spectrum measurement unit.

As such, whether or not the film formed on the substrate meets the pass criterion is determined based on the image data and the spectroscopic data. If it does not meet the pass criterion, the film formation is performed on the substrate for inspection, and the detailed measurement is performed on the film-formed substrate for inspection by acquiring the spectroscopic data from two-dimensionally dispersed measurement positions by the spectrum measurement unit. With this configuration, if the film formed on the typical substrate does not meet the pass criterion, it is possible to perform the detailed measurement on the film-formed substrate for inspection by the same spectrum measurement unit. Also, the film on the typical substrate can be appropriately evaluated based on the image data and the spectroscopic data, and if the film does not meet the pass criterion, the detailed inspection can be performed by the same spectrum measurement unit. Therefore, the film can be evaluated in more detail.

The imaging unit may image the surface of the substrate while the holder is moved in one direction during the image acquisition process at the same time when the spectrum measurement unit may acquire the spectroscopic data by separating the light from different regions on the surface of the substrate into the spectroscopic components during the spectroscopic measurement process.

With this configuration, it is possible to acquire the image data by the imaging unit 33 while moving the holder 31 in one direction and acquire the spectroscopic data by the spectrum measurement unit 40 at the same time. Therefore, although the image data and the spectroscopic data are both acquired, the time required for acquiring them does not increase. Thus, the image data and the spectroscopic data can be acquired effectively.

Further, the coating/developing apparatus 2 as a substrate inspection system according to the present exemplary embodiment includes the imaging unit 33 provided in the substrate processing apparatus and configured to acquire image data by imaging the surface of a substrate for color information on which the same patterning as on a target substrate is performed and a film has been formed; the film thickness measurement unit (spectrum measurement unit 40) provided in the substrate processing apparatus and configured to measure the film thickness of a substrate for film thickness measurement on which a film has been formed under the same conditions as on the substrate for color information; and the model creation unit 107 configured to create a film thickness model indicative of the correlation between information about color change on the surface of the substrate for color information caused by forming the film, which is acquired based on the image data, and the film thickness of the substrate for film thickness measurement, which is measured by the film thickness calculation unit 104.

Also, the substrate inspection method according to the present exemplary embodiment is to be performed in a substrate inspection system including a substrate processing apparatus configured to perform film formation on a target substrate, and includes an imaging process of acquiring image data by imaging the surface of a substrate for color information on which the same patterning as on the target substrate is performed and a film has been formed in the substrate processing apparatus; a film thickness measurement process of measuring the film thickness of a substrate for film thickness measurement on which a film has been formed under the same conditions as on the substrate for color information in the substrate processing apparatus; and a model creating process of creating a film thickness model indicative of the correlation between information about color change on the surface of the substrate for color information caused by forming the film, which is acquired based on the image data, and the film thickness measured in the film thickness measurement process.

According to the above-described substrate inspection system and substrate inspection method, the information about color change on the surface of the substrate for color information can be acquired based on image data of the surface of the substrate for color information and the film thickness of the substrate for film thickness measurement on which the film has been formed under the same conditions can be measured by the spectrum measurement unit 40 serving as the film thickness measurement unit. Also, the film thickness model indicative of the correlation between the information about color change and the film thickness can be created by combining these information. Therefore, it is possible to more simply create a model for calculating the film thickness of the film on the target substrate.

Conventionally, a method of previously storing the correlation between the information obtained from the image data and the film thickness and estimating the film thickness of the target substrate from the image data of the target substrate based on the stored correlation has been considered. However, conventionally, in order to accurately measure the film thickness of the film formed on the substrate, it is necessary to analyze the substrate by a film thickness measurement apparatus provided separately from the substrate processing apparatus. For this reason, it is considered that it is complicated to create the model for calculating the film thickness of the film on the target substrate, and the time required therefor increases.

Meanwhile, in the above-described substrate inspection system and substrate inspection method, the film thickness calculation unit 104 may specify the film thickness of the film formed on the substrate for film thickness measurement based on the result of the inspection in the inspection unit U3 (spectroscopic data acquired by the spectrum measurement unit 40). Specifically, film thickness can be calculated based on spectroscopic data by the spectrum measurement unit 40. Also, the substrate for color information on which the pattern has been formed in the same manner as on the target substrate may be used to acquire the information about color change at the time of the film formation from the result of the imaging by the imaging unit 33 in the inspection unit U3. Therefore, the model creation unit 107 of the control device 100 can create the model by combining these information. That is, the substrate processing apparatus can create the model to be used for calculating the film thickness of the target substrate based on the result of the inspection in the inspection unit U3. Therefore, it is possible to more simply create the model compared with conventional cases.

The substrate inspection system may further include the film thickness calculation unit 104. The imaging unit 33 is configured to acquire image data of the target substrate by imaging the target substrate on which the film has been formed, and the film thickness calculation unit 104 is configured to estimate the film thickness of the target substrate based on information about color change on the surface of the target substrate caused by forming the film, which is acquired based on the image data of the target substrate and the film thickness model.

The substrate inspection method may further include a film thickness calculation process of estimating the film thickness of the target substrate based on information about color change on the surface of the target substrate caused by forming the film, which is acquired based on the image data of the target substrate obtained by imaging the target substrate on which the film is formed, and a film thickness model.

With this configuration, the film thickness calculation unit 104 may estimate the film thickness of the target substrate based on information about color change on the surface of the target substrate caused by forming the film, which is acquired based on the image data of the target substrate, and the film thickness model. Therefore, the model obtained as described above can be applied appropriately to the film thickness estimation of the target substrate.

Also, the substrate inspection system may further include a coating unit U1 and a heat treatment unit U2 as a film forming unit configured to perform multiple processings of forming the film on each of the substrate for color information and the substrate for film thickness measurement, and the film forming unit may alternately perform a processing of forming the film on the substrate for color information and a processing of forming the film on the substrate for film thickness measurement.

Further, the substrate inspection method may further include performing multiple processings of forming the film on each of the substrate for color information and the substrate for film thickness measurement, and in the performing of the multiple processings, forming the film on the substrate for color information and forming the film on the substrate for film thickness measurement may be performed alternately.

As described above, the film forming unit configured to form the film on each of the substrate for color information and the substrate for film thickness measurement alternately performs a processing of the substrate for color information and a processing of the substrate for film thickness measurement, and, thus, films can be formed on the respective substrate under more similar conditions. Therefore, it is possible to more precisely match the information about color change obtained from the substrate for color information with the film thickness obtained from substrate for film thickness measurement. Thus, it is possible to create the model with higher precision.

A substrate having a flat surface may be used as the substrate for film thickness measurement.

As described above, the substrate having the flat surface is used as the substrate for film thickness measurement and the film is formed on the substrate for film thickness measurement and the film thickness thereof is measured. Therefore, the film thickness measurement unit can measure film thickness more precisely. Thus, it is possible to create the model with higher precision.

The imaging unit 33 and the spectrum measurement unit 40 as a film thickness measurement unit may be provided in a single unit.

Also, the imaging process and the film thickness measurement process may be performed concurrently.

If the imaging unit 33 and the spectrum measurement unit 40 are provided in the single unit such as the inspection unit U3 described above in the exemplary embodiment, it is possible to suppress the scale-up of the apparatus and achieve the apparatus configuration for simply creating a model. Also, since the imaging process and the film thickness measurement process are performed concurrently, it is possible to reduce processing time.

In the above-described exemplary embodiment, an example where the imaging unit 33 and the spectrum measurement unit 40 are provided in the inspection unit U3 has been described. However, the film thickness measurement unit for creating the model and the imaging unit 33 may be provided in different units, respectively. As described above, if the film thickness of the film formed on the substrate for film thickness measurement can be measured by the spectrum measurement unit 40 of the inspection unit U3, the film thickness model may be created based on this measurement result. Herein, the method of measuring film thickness is not limited to the acquisition of the spectrum data. Specifically, a unit for measuring the film thickness may be provided separately from the inspection unit U3, and when the model is created, the unit for measuring the film thickness may be used to measure the film thickness of the film on the substrate for film thickness measurement. In this case, when the film thickness of the target substrate is calculated, the film thickness may be estimated and evaluated based on the image data acquired by the inspection unit U3.

Other Exemplary Embodiments

While various exemplary embodiments have been described above, various omissions, substitutions, and changes may be made without being limited to the above-described exemplary embodiments. Further, other exemplary embodiments can be implemented by combining elements in different exemplary embodiments.

For example, in the above-described exemplary embodiment, there has been described the example where the inspection unit U3 is provided in each of the processing modules 11, 12 and 13. However, the inspection unit U3 may not be provided in each module, but may be provided independently from each module.

Also, the films formed in the processing modules 11, 12 and 13 are just an example and may be appropriately modified. For example, a film may be further formed on the resist film. That is, the film inspection method described in the present exemplary embodiment is not limited to the kind and number of films and can be applied to various films to be formed on the substrate.

Further, in the above-described exemplary embodiment, there has been described the example where the spectrum measurement unit 40 is provided only at one position along the center line L of the wafer W. However, the spectrum measurement unit 40 may be provided along a line different from the center line L. If the spectrum measurement unit 40 is provided at a position corresponding to the center line L of the wafer W while the wafer W is moved by moving the holder 31, it is possible to acquire the spectrum data from the regions along the center line L of the wafer W. Therefore, the spectroscopic measurement can be performed on the single line and the spectrum data can be acquired in the broader range. A plurality of spectrum measurement units 40 may be provided. There has been described the example where the spectrum data is acquired by the spectrum measurement unit 40, but the spectroscopic data acquired by the spectrum measurement unit 40 may not be spectrum data.

According to the exemplary embodiments, it is possible to provide a technique of more simply creating a model for calculating the film thickness of a film formed on a target substrate.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing system including a film forming apparatus configured to perform film formation on a target substrate and configured to inspect the target substrate, the substrate processing system comprising:
   an imaging unit provided in the film forming apparatus and configured to acquire image data by imaging a surface of a first reference substrate on which a film is formed for color information;
   a spectrum measurement unit provided in the film forming apparatus and configured to measure a film thickness of a second reference substrate on which a film is formed under same conditions as on the first reference substrate; and
   a controller configured to create a film thickness model corresponding to a correlation between information about color change on the surface of the first reference substrate caused by forming the film, which is acquired based on the image data, and the film thickness of the second reference substrate, which is measured by the spectrum measurement unit.

2. The substrate processing system of claim 1, further comprising:
   wherein the imaging unit is further configured to acquire image data of the target substrate by imaging the target substrate on which a film is formed, and
   the controller is further configured to estimate a film thickness of the target substrate based on information about color change on the surface of the target substrate caused by forming the film, which is acquired based on the image data of the target substrate, and the film thickness model.

3. The substrate processing system of claim 1, further comprising:
   a film forming unit configured to perform multiple processings of forming the film on each of the first reference substrate and the second reference substrate,
   wherein the film forming unit alternately performs a processing of forming the film on the first reference substrate and a processing of forming the film on the second reference substrate.

4. The substrate processing system of claim 1,
   wherein the second reference substrate has a flat surface.

5. The substrate processing system of claim 1,
   wherein the imaging unit and the spectrum measurement unit are provided in a single unit.

6. A substrate processing method performed in a substrate processing system including a film forming apparatus configured to perform film formation on a target substrate and configured to inspect the target substrate, the substrate processing method comprising:
   in the film forming apparatus, acquiring image data by imaging a surface of a first reference substrate on which a film is formed for color information;
   in the film forming apparatus, measuring a film thickness of a second reference substrate on which a film is formed under same conditions as on the first reference substrate; and
   creating a film thickness model corresponding to a correlation between information about color change on the surface of the first reference substrate caused by forming the film, which is acquired based on the image data, and the film thickness measured on the second reference substrate.

7. The substrate processing method of claim 6, further comprising:
   estimating a film thickness of the target substrate based on information about color change on a surface of the target substrate caused by forming the film, which is acquired based on image data of the target substrate obtained by imaging the target substrate on which the film is formed, and the film thickness model.

8. The substrate processing method of claim 6, further comprising:
   performing multiple processings of forming the film on each of the first reference substrate and the second reference substrate,
   wherein in the performing of the multiple processings, forming the film on the first reference substrate and forming the film on the second reference substrate are performed alternately.

9. The substrate processing method of claim 6,
   wherein the second reference substrate has a flat surface.

10. The substrate processing method of claim 6,
    wherein the acquiring of the image data and the measuring of the film thickness are performed in parallel.

11. A non-transitory computer-readable recording medium having stored thereon computer-executable instructions that, in response to execution, cause an apparatus to perform a substrate processing method as claimed in claim 6.

* * * * *